US011043626B2

(12) United States Patent
Yosui et al.

(10) Patent No.: US 11,043,626 B2
(45) Date of Patent: Jun. 22, 2021

(54) MULTILAYER SUBSTRATE

(71) Applicant: Murata Manufacturing Co., Ltd., Nagaokakyo (JP)

(72) Inventors: Kuniaki Yosui, Nagaokakyo (JP); Shingo Ito, Nagaokakyo (JP); Isamu Morita, Nagaokakyo (JP); Naoki Gouchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/294,975

(22) Filed: Mar. 7, 2019

(65) Prior Publication Data
US 2019/0207077 A1    Jul. 4, 2019

Related U.S. Application Data

(63) Continuation of application No. PCT/JP2017/032905, filed on Sep. 12, 2017.

(30) Foreign Application Priority Data

Oct. 24, 2016  (JP) .............................. JP2016-207871

(51) Int. Cl.
*H01L 41/047* (2006.01)
*H01L 41/083* (2006.01)
(Continued)

(52) U.S. Cl.
CPC .......... *H01L 41/0475* (2013.01); *H01F 7/20* (2013.01); *H01F 27/2804* (2013.01);
(Continued)

(58) Field of Classification Search
CPC ..... H01L 41/0475; H01L 41/083; H01F 7/20; H05K 3/4691; H05K 1/11; H05K 1/14; H05K 1/18; H05K 1/181–187
(Continued)

(56) References Cited

U.S. PATENT DOCUMENTS 5,615,088 A    3/1997  Mizumo
8,035,983 B2 * 10/2011 Takahashi ............ H05K 3/4691
                                                361/792
(Continued)

FOREIGN PATENT DOCUMENTS

JP     06-334279 A     12/1994
JP    2002-246748 A     8/2002
(Continued)

OTHER PUBLICATIONS

Official Communication issued in International Patent Application No. PCT/JP2017/032905, dated Dec. 12, 2017.

*Primary Examiner* — Tuan T Dinh
(74) *Attorney, Agent, or Firm* — Keating & Bennett, LLP

(57) ABSTRACT

A multilayer substrate includes a stacked body including first and second flexible insulating base material layers, and an actuator conductor pattern on at least the first insulating base material layer. The stacked body includes a first region including stacked first and second insulating base material layers, and a second region including stacked second insulating base material layers. The first region includes an actuator function portion in a portion thereof, the actuator function portion including the actuator conductor pattern. The thickness of the first insulating base material layer including the actuator conductor pattern is smaller than the thickness of one second insulating base material layer.

20 Claims, 19 Drawing Sheets

(51) Int. Cl.
*H01L 41/09* (2006.01)
*H01L 41/193* (2006.01)
*H01F 27/28* (2006.01)
*H01F 27/32* (2006.01)
*H05K 1/18* (2006.01)
*H01F 7/20* (2006.01)
*H05K 3/46* (2006.01)
*H05K 1/14* (2006.01)
*H05K 1/16* (2006.01)
*H01F 17/00* (2006.01)

(52) U.S. Cl.
CPC ......... *H01F 27/323* (2013.01); *H01L 41/083* (2013.01); *H01L 41/0986* (2013.01); *H01L 41/193* (2013.01); *H05K 1/181* (2013.01); *H05K 3/4691* (2013.01); *H01F 2017/006* (2013.01); *H01F 2027/2809* (2013.01); *H05K 1/147* (2013.01); *H05K 1/165* (2013.01); *H05K 3/4635* (2013.01); *H05K 2201/1003* (2013.01)

(58) Field of Classification Search
USPC ......... 361/790, 792–795, 803; 174/258–261; 257/685–690
See application file for complete search history.

(56) References Cited

U.S. PATENT DOCUMENTS

| 8,359,738 | B2* | 1/2013 | Takahashi | H05K 3/4691 29/830 |
| 9,674,968 | B2* | 6/2017 | Kim | H05K 3/4691 |
| 2002/0112880 | A1 | 8/2002 | Wakimoto et al. | |
| 2008/0047737 | A1 | 2/2008 | Sahara et al. | |
| 2008/0284277 | A1* | 11/2008 | Kwon | H01L 41/0471 310/309 |
| 2009/0014205 | A1* | 1/2009 | Kobayashi | H05K 3/4691 174/255 |
| 2009/0229876 | A1* | 9/2009 | Takahashi | H05K 3/4691 174/378 |
| 2014/0185140 | A1 | 7/2014 | Kawai | |
| 2014/0345911 | A1* | 11/2014 | Lee | H05K 3/4691 174/251 |
| 2015/0181699 | A1* | 6/2015 | Ikemoto | H05K 1/0281 174/254 |
| 2015/0311423 | A1* | 10/2015 | Murakami | H01L 41/083 310/366 |
| 2016/0012950 | A1* | 1/2016 | Nishino | G03B 5/00 359/814 |
| 2016/0012963 | A1* | 1/2016 | Yosui | H01F 5/00 174/260 |
| 2016/0014893 | A1 | 1/2016 | Yosui | |
| 2017/0011838 | A1 | 1/2017 | Asada | |

FOREIGN PATENT DOCUMENTS

| JP | 2003-251741 | A | 9/2003 | |
| JP | 2005-228946 | A | 8/2005 | |
| JP | 2008-034588 | A | 2/2008 | |
| JP | 2011-108929 | A | 6/2011 | |
| JP | 2013-131642 | A | 7/2013 | |
| JP | 2013-232462 | A | 11/2013 | |
| JP | 2014-127998 | A | 7/2014 | |
| WO | 2015/015975 | A1 | 2/2015 | |
| WO | 2015/083525 | A1 | 6/2015 | |
| WO | WO-2015079773 | A1* | 6/2015 | ............... G03B 5/00 |
| WO | 2015/152333 | A1 | 10/2015 | |

* cited by examiner

MULTILAYER SUBSTRATE

CROSS REFERENCE TO RELATED APPLICATIONS

This application claims the benefit of priority to Japanese Patent Application No. 2016-207871 filed on Oct. 24, 2016 and is a Continuation Application of PCT Application No. PCT/JP2017/032905 filed on Sep. 12, 2017. The entire contents of each application are hereby incorporated herein by reference.

BACKGROUND OF THE INVENTION

1. Field of the Invention

The present invention relates to a multilayer substrate, and more particularly, to a multilayer substrate including an actuator function portion.

2. Description of the Related Art

Conventionally, various types of multilayer substrates including a stacked body obtained by stacking a plurality of insulating base material layers that have flexibility, and a coil provided in contact with the stacked body have been known. For example, International Publication No. 2015/083525 discloses a multilayer substrate including a stacked body including a thicker portion (hereinafter referred to as a first region) and a thinner portion (hereinafter referred to as a second region), and a coil provided in the first region. Since, in the multilayer substrate, the number of stacked layers of the insulating base material layers in the second region is smaller than the number of stacked layers of the insulating base material layer in the first region, the second region has flexibility.

The multilayer substrate may be connected using the flexibility of the second region when being connected to a substrate or the like. In other words, the multilayer substrate may be fixed to a substrate or the like while the second region is bent.

However, when the multilayer substrate may be fixed to a substrate or the like while the second region is bent, bending stress to be generated in the second region may be transmitted to the first region, so that a coil provided in the first region may deform or a coil axis may tilt. Therefore, the characteristics of the coil may change. It is to be noted that such a problem may similarly occur not only in a case in which the coil is provided in the stacked body but also in a case in which an actuator function portion that converts electrical energy into physical motion is provided in the stacked body.

SUMMARY OF THE INVENTION

Preferred embodiments of the present invention provide multilayer substrates each including an actuator function portion, and more specifically, multilayer substrates each including an actuator function portion of which the characteristic change is small even when a region having flexibility is bent.

A multilayer substrate according to a preferred embodiment of the present invention includes a stacked body including a plurality of insulating base material layers that are stacked and that include a first insulating base material layer and a second insulating base material layer that have flexibility, the stacked body including a first region and a second region, and an actuator conductor pattern provided on at least the first insulating base material layer, and the number of stacked layers of the insulating base material layers in the first region is greater than the number of stacked layers of the insulating base material layers in the second region, the second insulating base material layer is provided over the first region and the second region, the first region includes a stack of the first insulating base material layer and the second insulating base material layer and includes an actuator function portion in a portion of the first region, the actuator function portion including the actuator conductor pattern, and a thickness of the first insulating base material layer including the actuator conductor pattern is smaller than a thickness of one second insulating base material layer.

The rigidity of a conductor pattern is typically relatively higher than the rigidity of an insulating base material layer made of a resin material. Therefore, with this configuration, the conductor ratio of the actuator function portion is increased and the rigidity of the actuator function portion is also increased. Accordingly, even when bending stress generated when the second region (a flexible portion) is bent is applied to the first region, deformation of the actuator function portion is significantly reduced or prevented, and characteristic changes of the actuator function portion are significantly reduced or prevented.

In a multilayer substrate according to a preferred embodiment of the present invention, the second insulating base material layer may preferably include a plurality of second insulating base material layers, and the thickness of the first insulating base material layer including the actuator conductor pattern may preferably be smaller than a thickness of at least one second insulating base material layer among the plurality of second insulating base material layers. Even when the second insulating base material layer includes a plurality of second insulating base material layers, with this configuration, the conductor ratio of the actuator function portion is increased and the rigidity of the actuator function portion is increased.

In a multilayer substrate according to a preferred embodiment of the present invention, the thickness of the first insulating base material layer including the actuator conductor pattern may preferably be smaller than a thickness of any second insulating base material layer among the plurality of second insulating base material layers. With this configuration, as compared with a case in which the thickness of one second insulating base material layer among the plurality of second insulating base material layers is smaller than the thickness of the first insulating base material layer on which the actuator conductor pattern is provided, the conductor ratio of the actuator function portion is further increased, and thus the rigidity of the actuator function portion is further increased.

In a multilayer substrate according to a preferred embodiment of the present invention, the actuator conductor pattern may preferably be provided only on the first insulating base material layer and disposed on a layer other than a boundary surface between the first insulating base material layer and the second insulating base material layer. In this configuration, the actuator conductor pattern is not provided on the second insulating base material layer provided over the first region and the second region. Accordingly, with this configuration, the independence (isolation of stress) of the actuator function portion and the second region is increased, and, even when bending stress generated when the second region is bent is applied to the first region, deformation of the actuator function portion is further significantly reduced or prevented.

In a multilayer substrate according to a preferred embodiment of the present invention, a reinforcement film may preferably be provided in contact with the first insulating base material layer and may have a modulus of elasticity greater than a modulus of elasticity of the plurality of insulating base material layers. With this configuration, the rigidity of the actuator conductor pattern is further increased, so that, even when bending stress generated when the second region (a flexible portion) is bent is applied to the first region, deformation of the actuator function portion is further significantly reduced or prevented, and characteristic changes of the actuator function portion are further significantly reduced or prevented.

In a multilayer substrate according to a preferred embodiment of the present invention, a dummy conductor may preferably be provided in contact with the first insulating base material layer and not electrically connected to the actuator conductor pattern. With this configuration, the conductor ratio of the actuator function portion is further increased and the rigidity of the actuator function portion is further increased. Accordingly, even when bending stress generated when the second region (a flexible portion) is bent is applied to the first region, deformation of the actuator function portion is further significantly reduced or prevented, and characteristic changes of the actuator function portion are further significantly reduced or prevented.

According to various preferred embodiments of the present invention, multilayer substrates each including an actuator function portion, and more specifically, multilayer substrates each including an actuator function portion of which characteristic changes are reduced even when a region having flexibility is bent are able to be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
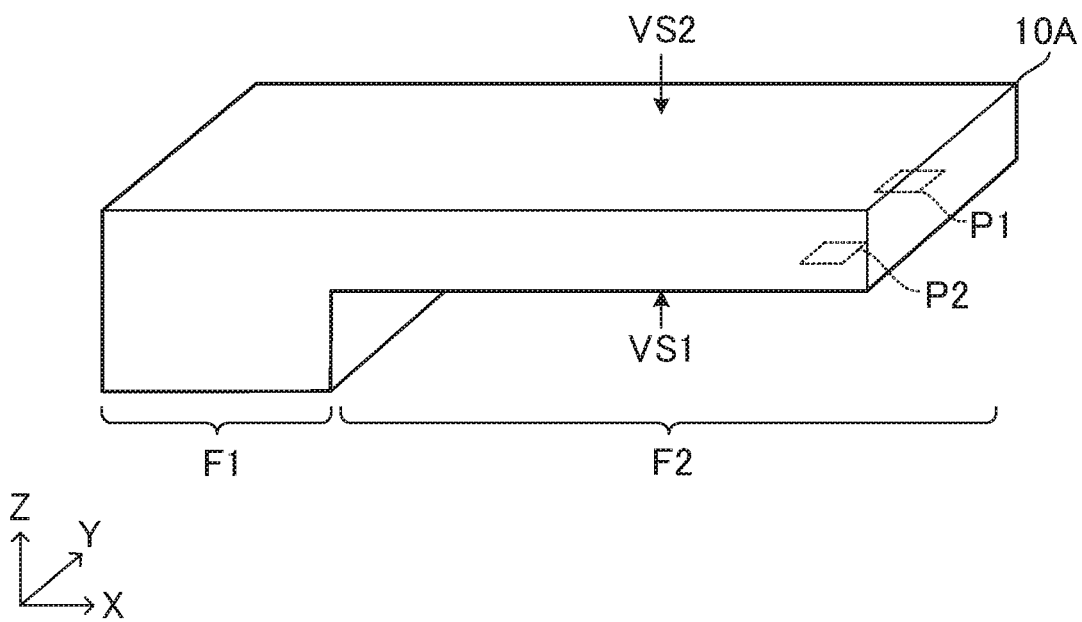
FIG. 1 is an external perspective view of a multilayer substrate 101 according to a first preferred embodiment of the present invention.

Hereinafter, a plurality of preferred embodiments of the present invention will be described with reference to the attached drawings and several specific examples. In the drawings, the same or similar components and elements are denoted by the same reference signs. While preferred embodiments are divided and described for the sake of convenience in facilitating description or understanding of main points, elements described in different preferred embodiments are able to be partially replaced and combined with each other. In the second and subsequent preferred embodiments, a description of features common to the first preferred embodiment will be omitted, and different features are primarily described. In particular, a description of similar advantageous operational effects achieved by similar structures will not be repeated in each preferred embodiment.

First Preferred Embodiment

Figure 2:
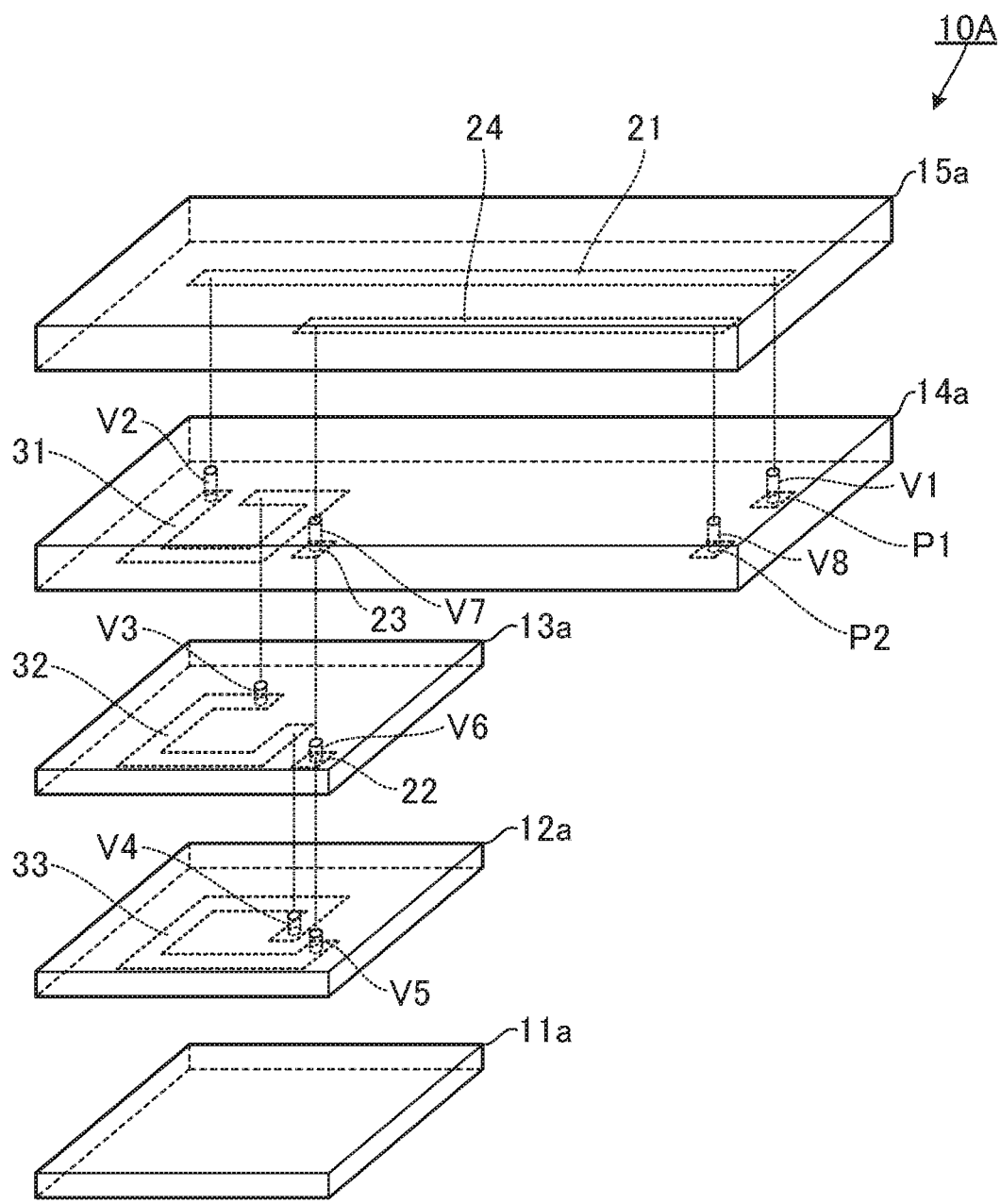
FIG. 2 is an exploded perspective view of the multilayer substrate 101.
Figure 3:
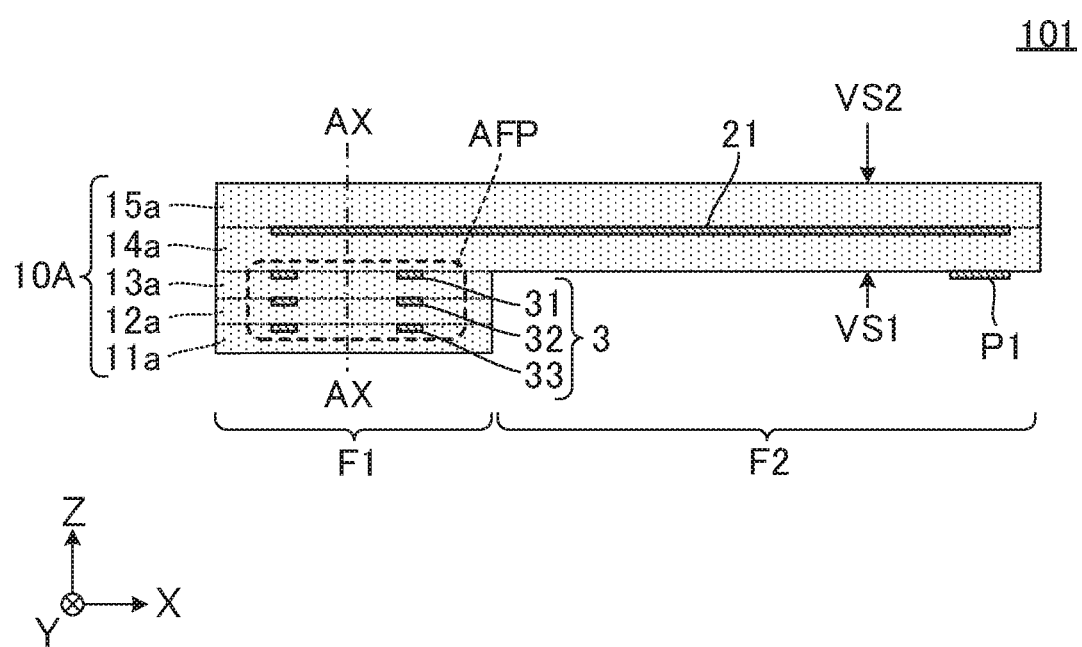
FIG. 3 is a cross-sectional view of the multilayer substrate 101.

FIG. 1 is an external perspective view of a multilayer substrate 101 according to a first preferred embodiment of the present invention. FIG. 2 is an exploded perspective view of the multilayer substrate 101. FIG. 3 is a cross-sectional view of the multilayer substrate 101. It is to be noted that, in FIG. 3, the thickness of each portion is illustrated in an exaggerated manner. Each of the cross-sectional views in the following preferred embodiments of the present invention also includes an exaggerated feature.

The multilayer substrate 101 includes a stacked body 10A, coil conductors 31, 32, and 33, and external connection terminals P1 and P2. The stacked body 10A includes a first principal surface VS1 and a second principal surface VS2 that face each other, and the external connection terminals P1 and P2 are provided on the first principal surface VS1.

The stacked body 10A is preferably, for example, a rectangular or substantially rectangular insulating flat plate of which the longitudinal direction coincides or substantially coincides with the X-axis direction, and includes a first region F1 and a second region F2. The first region F1, as shown in FIG. 3, includes an actuator function portion AFP (to be described in detail later) in a portion of the first region F1. The stacked body 10A is obtained by stacking a plurality of insulating base material layers 11a, 12a, 13a, 14a, and 15a that have flexibility. The plurality of insulating base material layers 11a, 12a, 13a, 14a, and 15a are preferably resin layers, for example, made of polyimide (PI), liquid crystal polymer (LCP), or other suitable material.

The first region F1 of the stacked body 10A is obtained by stacking the insulating base material layers 11a, 12a, 13a, 14a, and 15a in this order. The second region F2 is obtained by stacking the insulating base materials 14a and 15a in this order. As shown in FIG. 3, the insulating base material layers 14a and 15a are insulating base material layers that extend over the first region F1 and the second region F2.

In the first preferred embodiment, the insulating base material layers 11a, 12a, and 13a correspond to the "first insulating base material layer", and the insulating base material layers 14a and 15a correspond to the "second insulating base material layer".

The number of stacked layers (five layers) of the insulating base material layers in the first region F1 of the stacked body 10A is larger than the number of stacked layers (two layers) of the insulating base material layers in the second region F2. Therefore, the first region F1 of the stacked body 10A is harder than the second region F2, and is more difficult to bend than the second region F2. The second region F2 is more flexible than the first region F1, and is easier to bend than the first region F1.

Each of the insulating base material layers 11a, 12a, and 13a is preferably, for example, a rectangular or substantially rectangular flat plate that has flexibility. Each of the insulating base material layers 14a and 15a is preferably, for example, a rectangular or substantially rectangular flat plate that has flexibility, and has a longer length in the X-axis direction than the length of each of the insulating base material layers 11a, 12a, and 13a. The plane shapes of the insulating base material layers 11a, 12a, and 13a are the same or substantially the same, and the plane shapes of the insulating base material layers 14a and 15a are the same or substantially the same.

The bottom surface (the bottom surface of the insulating base material layer 12a in FIG. 2) of the insulating base material layer 12a includes a coil conductor 33. The coil conductor 33 is preferably, for example, a rectangular or substantially rectangular loop shaped conductor pattern including about one turn wound along the outer shape of the insulating base material layer 12a. In addition, the insulating base material layer 12a includes interlayer connection conductors V4 and V5 that extend in the Z-axis direction.

The bottom surface (the bottom surface of the insulating base material layer 13a in FIG. 2) of the insulating base material layer 13a includes a coil conductor 32 and a conductor 22. The coil conductor 32 is preferably, for example, a rectangular or substantially rectangular loop shaped conductor pattern including about one turn wound along the outer shape of the insulating base material layer 13a. The conductor 22 is preferably, for example, a rectangular or substantially rectangular conductor pattern. In addition, the insulating base material layer 13a includes interlayer connection conductors V3 and V6 that extend in the Z-axis direction.

The bottom surface (the bottom surface of the insulating base material layer 14a in FIG. 2) of the insulating base material layer 14a includes a coil conductor 31, a conductor 23, and external connection terminals P1 and P2. The coil conductor 31 is preferably, for example, a rectangular or substantially rectangular loop shaped conductor pattern including about one turn and is disposed in the vicinity of one end (the left end portion of the insulating base material layer 14a in FIG. 2) of the insulating base material layer 14a. The conductor 23 is preferably, for example, a rectangular or substantially rectangular conductor pattern. The external connection terminals P1 and P2 are preferably, for example, rectangular or substantially rectangular conductor patterns that are disposed in the vicinity of the other end (the right end portion of the insulating base material layer 14a in FIG. 2) of the insulating base material layer 14a. In addition, the insulating base material layer 14a includes interlayer connection conductors V1, V2, V7, and V8 that extend in the Z-axis direction.

The bottom surface (the bottom surface of the insulating base material layer 15a in FIG. 2) of the insulating base material layer 15a includes conductors 21 and 24. The conductors 21 and 24 are preferably, for example, linear conductor patterns that extend in the X-axis direction.

The coil conductors 31, 32, and 33, the conductors 21, 22, 23, and 24, and the external connection terminals P1 and P2 are preferably conductor patterns made of a Cu foil or other suitable material, for example. Each of the interlayer connection conductors V1, V2, V3, V4, V5, V6, V7, and V8 is preferably, for example, a via conductor obtained by providing a via hole in an insulating base material layer and filling the via hole with conductive paste.

As shown in FIG. 2, the external connection terminal P1 is connected to the first end of the conductor 21 through the interlayer connection conductor V1. The second end of the conductor 21 is connected to the first end of the coil conductor 31 through the interlayer connection conductor V2. The second end of the conductor 31 is connected to the first end of the coil conductor 32 through the interlayer connection conductor V3. The second end of the coil conductor 32 is connected to the first end of the coil conductor 33 through the interlayer connection conductor V4. The second end of the coil conductor 33 is connected to the conductor 22 through the interlayer connection conductor V5. The conductor 22 is connected to the conductor 23 through the interlayer connection conductor V6, and the conductor 23 is connected to the first end of the conductor 24 through the interlayer connection conductor V7. The second end of the conductor 24 is connected to the external connection terminal P2 through the interlayer connection conductor V8.

In addition, as shown in FIG. 2, the coil conductors 31, 32, and 33 and the interlayer connection conductors V3 and V4 define a coil 3 preferably including, for example, a rectangular or substantially rectangular helical shape including about three turns. As shown in FIG. 3, the coil 3 includes a winding axis AX extending in a stacking direction (the Z-axis direction) in which the plurality of insulating base material layers 11a, 12a, 13a, 14a, and 15a are stacked. The one end of the coil 3 is connected to the external connection terminal P1, and the other end of the coil 3 is connected to the external connection terminal P2.

In the first preferred embodiment, the coil conductors 31, 32, and 33 correspond to the "actuator conductor pattern", and the coil 3 including the coil conductors 31, 32, and 33 correspond to the "actuator function portion". Therefore, the first region F1 of the stacked body 10A, as shown in FIG. 3, includes the actuator function portion AFP (the coil 3) in a portion of the first region F1.

In addition, as shown in FIG. 2 and FIG. 3, the thickness of the first insulating base material layer (the insulating base material layers 11a, 12a, and 13a) is smaller than the thickness (the thickness in the Z-axis direction) of the second insulating base material layer (the insulating base material layer 14a or the insulating base material layer 15a). In addition, as shown in FIG. 3, the total (TA: the total thickness in the Z-axis direction of the coil conductors 31, 32, and 33) of the conductor thickness of the actuator function portion AFP is larger (TA>T2) than the total of the conductor thickness (T2: the total thickness of the conductor 21 or the conductor 22) of the second region F2.

Figure 4:
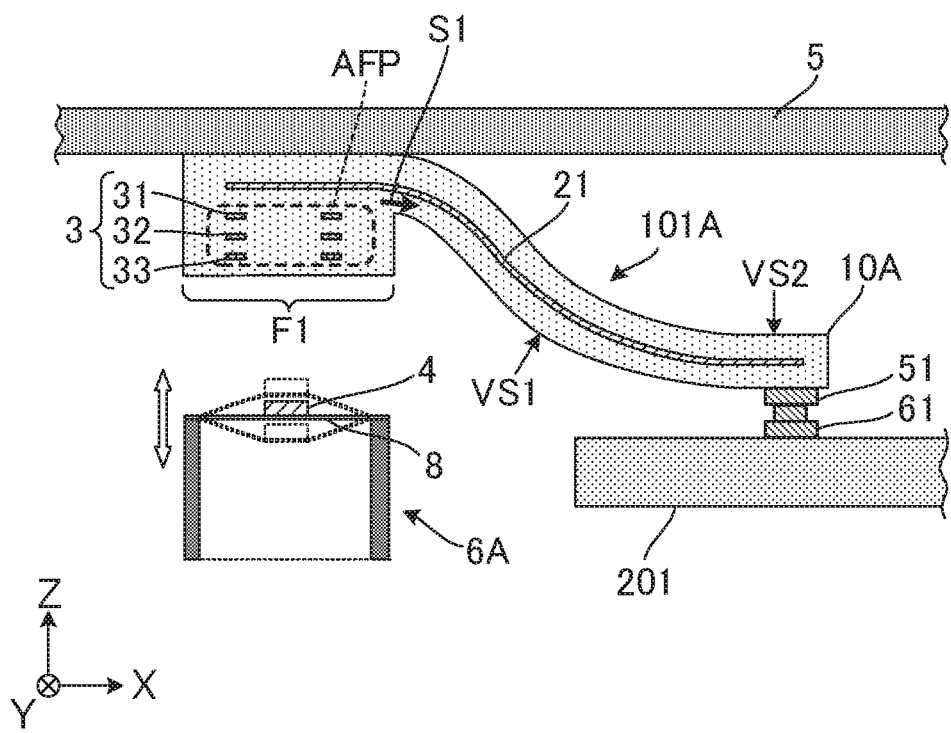
FIG. 4 is a cross-sectional view of a main portion of an electronic device 301 in which a multilayer substrate 101A is mounted.

The multilayer substrate 101 according to the first preferred embodiment of the present invention is used as follows, for example. FIG. 4 is a cross-sectional view of a main portion of an electronic device 301 in which a multilayer substrate 101A is mounted.

The electronic device 301 including the multilayer substrate according to the first preferred embodiment of the present invention is, for example, a portable telephone terminal, a smartphone, a tablet terminal, a notebook PC, a PDA, a wearable terminal (such as a smartwatch and smart glasses), a camera, a game machine, a toy, or other suitable device.

The electronic device 301 includes a multilayer substrate 101A, a housing 5, a circuit board 201, and an article 6A. Preferably, the housing 5 is made of, for example, a resin, and the circuit board 201 is, for example, a printed wiring board.

The multilayer substrate 101A is different from the multilayer substrate 101 in that two connectors 51 are provided. Other configurations are the same or substantially the same as the configurations of the multilayer substrate 101. The two connectors 51 are mounted on the first principal surface VS1 of the stacked body 10A, and are connected to the opposite ends of the coil 3, respectively. The article 6A includes a vibrating plate 8 and a magnet 4 attached to the vibrating plate 8.

The multilayer substrate 101A, the circuit board 201, and the article 6A are accommodated inside the housing 5. As shown in FIG. 4, the second principal surface VS2 of the first region F1 of the stacked body 10A is attached on the inside of the housing 5. The two connectors 51 included in the multilayer substrate 101A are respectively connected to two receptacles 61 mounted on the surface of the circuit board 201. As described above, the multilayer substrate 101A is connected to a circuit (a feed circuit, for example) provided in the circuit board 201.

In the first preferred embodiment, when current is supplied to the coil 3 (the actuator function portion AFP), the magnet 4 is displaced (as indicated by the outlined arrow shown in FIG. 4) in the Z-axis direction by a magnetic field to be emitted from the coil 3.

With the multilayer substrate 101 according to the first preferred embodiment of the present invention, the following advantageous effects are obtained.

In the first preferred embodiment, the thickness of the first insulating base material layer (the insulating base material layers 12a and 13a) is smaller than the thickness of one second insulating base material layer (the insulating base material layers 15a). In addition, in the first preferred embodiment, the total (the total thickness in the Z-axis direction of the coil conductors 31, 32, and 33) of the conductor thickness of the actuator function portion AFP is larger than the total (the total thickness of the conductor 21 or the conductor 24) of the conductor thickness of the second region F2. The rigidity of a conductor pattern is typically relatively higher than the rigidity of an insulating base material layer made of a resin material. Therefore, with this configuration, the conductor ratio of the actuator function portion AFP is increased and the rigidity of the actuator function portion AFP is also increased. Accordingly, even when bending stress (stress S1 in FIG. 4, for example) generated when the second region F2 is bent is applied to the first region F1, deformation of the actuator function portion AFP is significantly reduced or prevented, and characteristic changes of the actuator function portion AFP are significantly reduced or prevented.

It is to be noted that, in the first preferred embodiment, the thickness of the first insulating base material layer (the insulating base material layers 11a, 12a, and 13a) is smaller than the thickness of the plurality of second insulating base material layers (the insulating base material layers 14a and 15a). With this configuration, as compared with a case (described in the third preferred embodiment) in which the thickness of one second insulating base material layer among the plurality of second insulating base material layers (the insulating base material layers 14a and 15a) is smaller than the thickness of the first insulating base material layer (the insulating base material layers 12a and 13a) on which the actuator conductor pattern is provided, the conductor ratio of the actuator function portion AFP is further increased, and thus the rigidity of the actuator function portion AFP is further increased.

The multilayer substrate 101 according to the first preferred embodiment is manufactured by, for example, the following non-limiting examples of manufacturing steps.

First, the interlayer connection conductors V1, V2, V3, V4, V5, V6, V7, and V8 are formed in the insulating base material layers 11a, 12a, 13a, 14a, and 15a in a collective substrate state. The interlayer connection conductors are provided by making through holes by laser or other suitable method, filling the through holes with conductive paste including at least one of copper, silver, tin, or other suitable material, for example, and then curing the conductive paste by a process of applying heat and pressure. The insulating base material layers 11a, 12a, 13a, 14a, and 15a are preferably resin layers made of, for example, polyimide (PI), liquid-crystal polymer (LCP), or other suitable material.

Subsequently, a metal foil (a copper foil, for example) is laminated on one of the principal surfaces of the insulating base material layers 12a, 13a, 14a, and 15a in the collective substrate state, and the metal foil is patterned by photolithography, so that the coil conductors 31, 32, and 33, the conductors 21, 22, 23, and 24, and the external connection terminals P1 and P2 are formed. Specifically, the coil conductor 33 is formed on one of the principal surfaces of the insulating base material layer 12a. The coil conductor 32 and the conductor 22 are formed on one of the principal surfaces of the insulating base material layer 13a. In addition, the coil conductor 31, the conductor 23, and the external connection terminals P1 and P2 are formed on one of the principal surfaces of the insulating base material layer 14a. In addition, the conductors 21 and 24 are formed on one of the principal surfaces of the insulating base material layer 15a.

Subsequently, the insulating base material layers 11a, 12a, 13a, 14a, and 15a are stacked, conductive paste is solidified under heat and pressure and the insulating base material layers 11a, 12a, 13a, 14a, and 15a are pressure-bonded, so that the stacked body 10A in a collective substrate state is provided.

Lastly, an individual multilayer substrate 101 is obtained by dividing the stacked body 10A in the collective substrate state.

Second Preferred Embodiment

A second preferred embodiment of the present invention provides an example of a multilayer substrate including an actuator function portion other than a coil.

Figure 5:
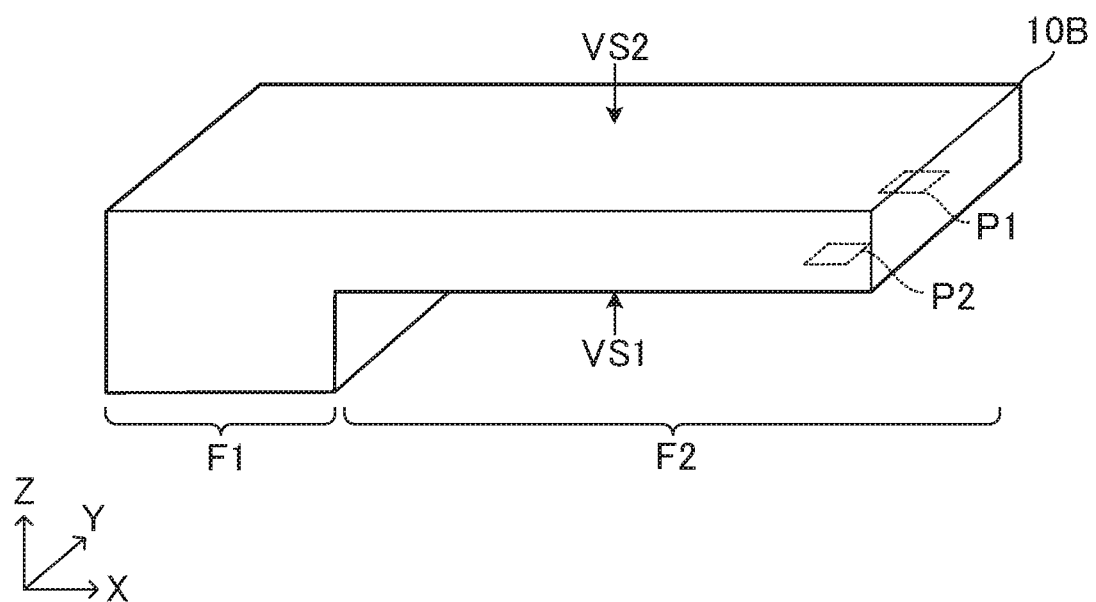
FIG. 5 is an external perspective view of a multilayer substrate 102 according to a second preferred embodiment of the present invention.
Figure 6:
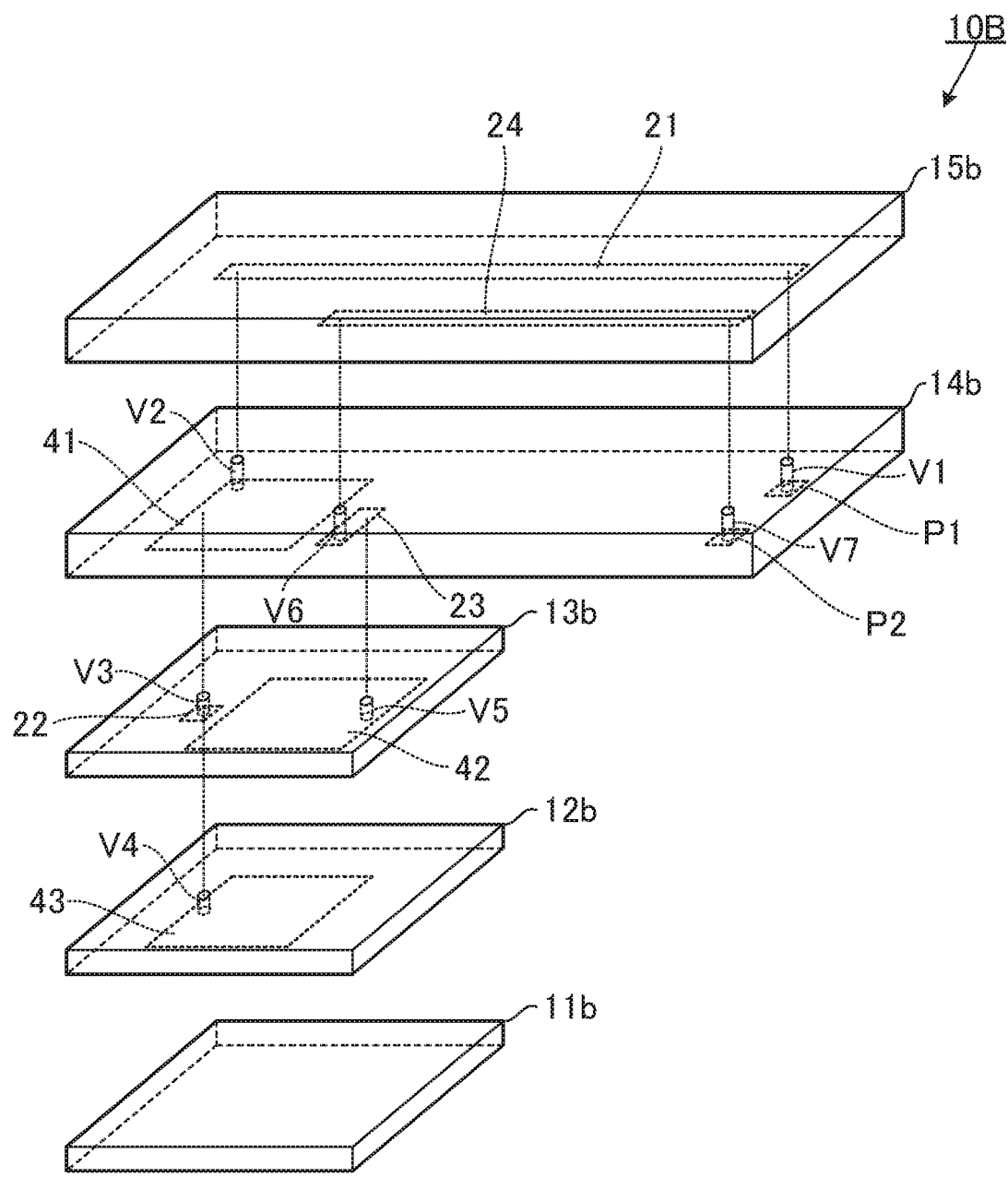
FIG. 6 is an exploded perspective view of the multilayer substrate 102.
Figure 7:
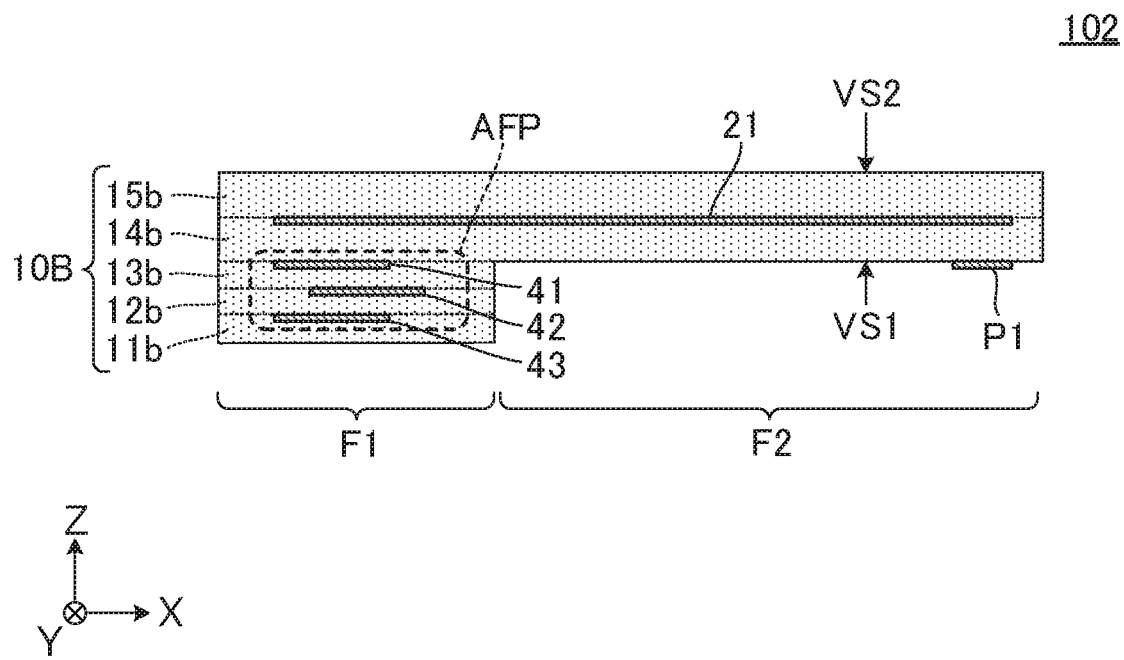
FIG. 7 is a cross-sectional view of the multilayer substrate 102.

FIG. 5 is an external perspective view of a multilayer substrate 102 according to the second preferred embodiment of the present invention. FIG. 6 is an exploded perspective view of the multilayer substrate 102. FIG. 7 is a cross-sectional view of the multilayer substrate 102.

The multilayer substrate 102 is different from the multilayer substrate 101 according to the first preferred embodiment in that the actuator function portion AFP is not a coil. Other configurations are the same or substantially the same as the configurations of the multilayer substrate 101.

Hereinafter, a description will be provided of a portion that is different from the multilayer substrate 101 according to the first preferred embodiment of the present invention.

The multilayer substrate 102 includes a stacked body 10B, plane electrodes 41, 42, and 43, and external connection terminals P1 and P2. The stacked body 10B is obtained by stacking a plurality of insulating base material layers 11b, 12b, 13b, 14b, and 15b that have flexibility. In addition, the plurality of insulating base material layers 11b, 12b, 13b, 14b, and 15b have piezoelectric properties. The insulating base material layers 11b, 12b, 13b, 14b, and 15b are preferably, for example, sheets of PVDF (polyvinylidene fluoride).

In the first preferred embodiment, the insulating base material layers 11b, 12b, and 13b correspond to the "first insulating base material layer", and the insulating base material layers 14b and 15b correspond to the "second insulating base material layer".

The shape of the insulating base material layers 11b, 12b, 13b, 14b, and 15b is the same or substantially the same as the shape of the insulating base material layers 11a, 12a, 13a, 14a, and 15a that are described in the first preferred embodiment.

The bottom surface (the bottom surface of the insulating base material layer 12b in FIG. 6) of the insulating base material layer 12b includes the plane electrode 43. The plane electrode 43 is preferably, for example, a rectangular or substantially rectangular conductor pattern. In addition, the insulating base material layer 12b includes the interlayer connection conductor V4 that extends in the Z-axis direction. The plane electrode 43 is preferably a conductor pattern made of a Cu foil or other suitable material, for example.

The bottom surface (the bottom surface of the insulating base material layer 13b in FIG. 6) of the insulating base material layer 13b includes the plane electrode 42 and the conductor 22. The plane electrode 42 and the conductor 22 are preferably, for example, rectangular or substantially rectangular conductor patterns. In addition, the insulating base material layer 13b includes the interlayer connection conductors V3 and V5 that extend in the Z-axis direction. The plane electrode 42 may preferably be a conductor pattern made of a Cu foil or other suitable material, for example.

The bottom surface (the bottom surface of the insulating base material layer 14b in FIG. 6) of the insulating base material layer 14b includes the plane electrode 41, the conductor 23, and the external connection terminals P1 and P2. The plane electrode is preferably, for example, a rectangular or substantially rectangular conductor pattern that is disposed in the vicinity of one end (the left end portion of the insulating base material layer 14b in FIG. 6) of the insulating base material layer 14b. The conductor 23 is preferably, for example, a rectangular or substantially rectangular conductor pattern. The external connection terminals P1 and P2 are preferably, for example, rectangular or substantially rectangular conductor patterns that are disposed in the vicinity of the other end (the right end portion of the insulating base material layer 14b in FIG. 6) of the insulating base material layer 14b. In addition, the insulating base material layer 14b includes the interlayer connection conductors V1, V2, V6, and V7 that extend in the Z-axis direction. The plane electrode 41 is preferably a conductor pattern made of a Cu foil or other suitable material, for example.

The bottom surface (the bottom surface of the insulating base material layer 15b in FIG. 6) of the insulating base material layer 15b includes the conductors 21 and 24. The conductors 21 and 24 have the same or substantially the same configurations as the configurations of the conductors 21 and 24 that are described in the first preferred embodiment.

As shown in FIG. 6, the external connection terminal P1 is connected to the first end of the conductor 21 through the interlayer connection conductor V1. The second end of the conductor 21 is connected to the plane electrode 41 through the interlayer connection conductor V2. In addition, the plane electrode 41 is connected to the plane electrode 43 through the conductor 22 and the interlayer connection conductors V3 and V4. The external connection terminal P2 is connected to the second end of the conductor 24 through the interlayer connection conductor V7. The first end of the conductor 24 is connected to the plane electrode 42 through the conductor 23 and the interlayer connection conductors V5 and V6.

In the second preferred embodiment, the plane electrodes 41, 42, and 43, the insulating base material layers 12b and 13b, and other suitable elements define a piezoelectric actuator. As shown in FIG. 7, the first region F1 of the stacked body 10B includes the actuator function portion AFP (the piezoelectric actuator) in a portion of the first region F1.

Specifically, the plane electrodes 41 and 43 are connected to the external connection terminal P1, and the plane electrode 42 is connected to the external connection terminal P2. As shown in FIG. 7, the plane electrode 41 and the plane electrode face each other, and the plane electrode 42 and the plane electrode 43 face each other. Therefore, a different voltage is applied to each of the external connection terminals P1 and P2, so that an electric field is generated between the plane electrode 41 and the plane electrode 42, and thus the insulating base material layer 13b (a piezoelectric body) interposed between the plane electrode 41 and the plane electrode 42 deforms. Similarly, a different voltage is applied to each of the external connection terminals P1 and P2, so that an electric field is generated between the plane electrode 43 and the plane electrode 42, and thus the insulating base material layer 12b (a piezoelectric body) interposed between the plane electrode 43 and the plane electrode 42 deforms.

In the second preferred embodiment, the plane electrodes 41, 42, and 43 correspond to the "actuator conductor pattern". In addition, the piezoelectric actuator defined by the plane electrodes 41, 42, and 43, the insulating base material layers 12b and 13b, and other suitable elements correspond to the "actuator function portion".

Figure 8:
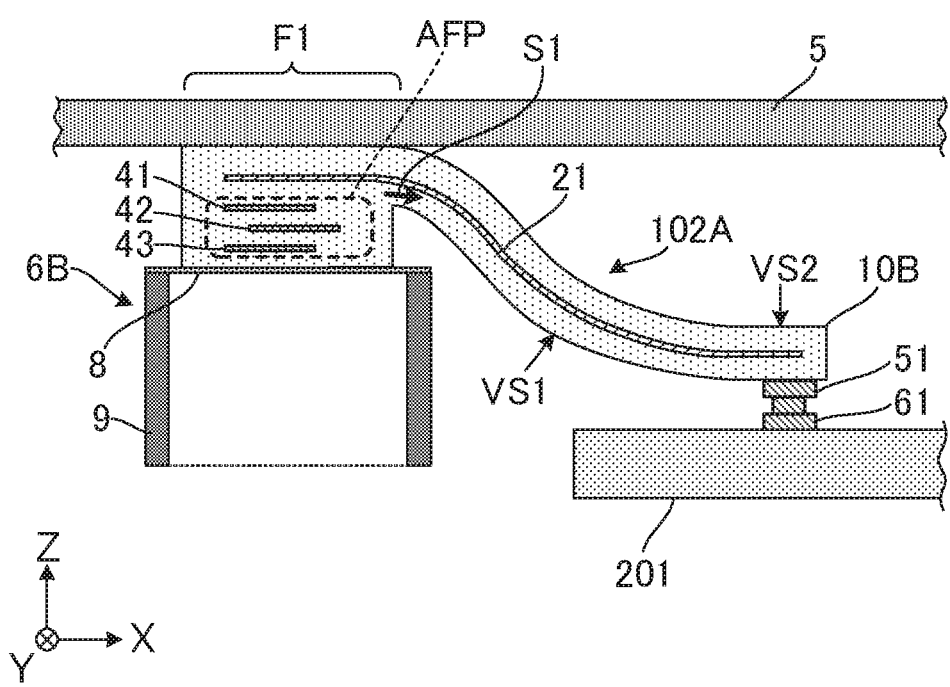
FIG. 8 is a cross-sectional view of a main portion of an electronic device 302 in which a multilayer substrate 102A is mounted.
Figure 9A:
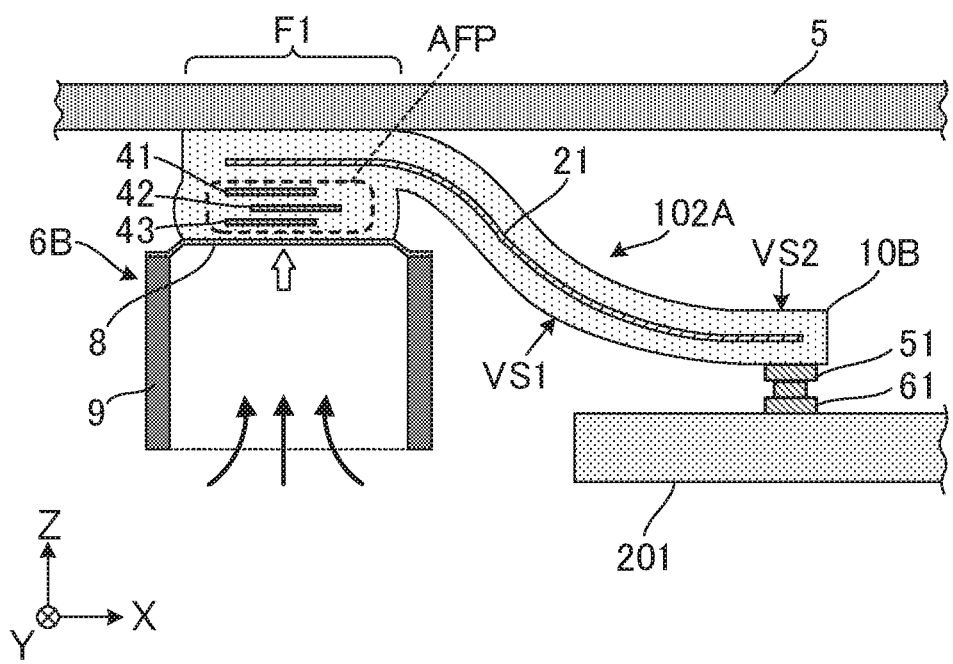
FIG. 9A is a cross-sectional view of the main portion of the electronic device 302, the view showing a state of the multilayer substrate 102A when an actuator function portion AFP is operated.
Figure 9B:
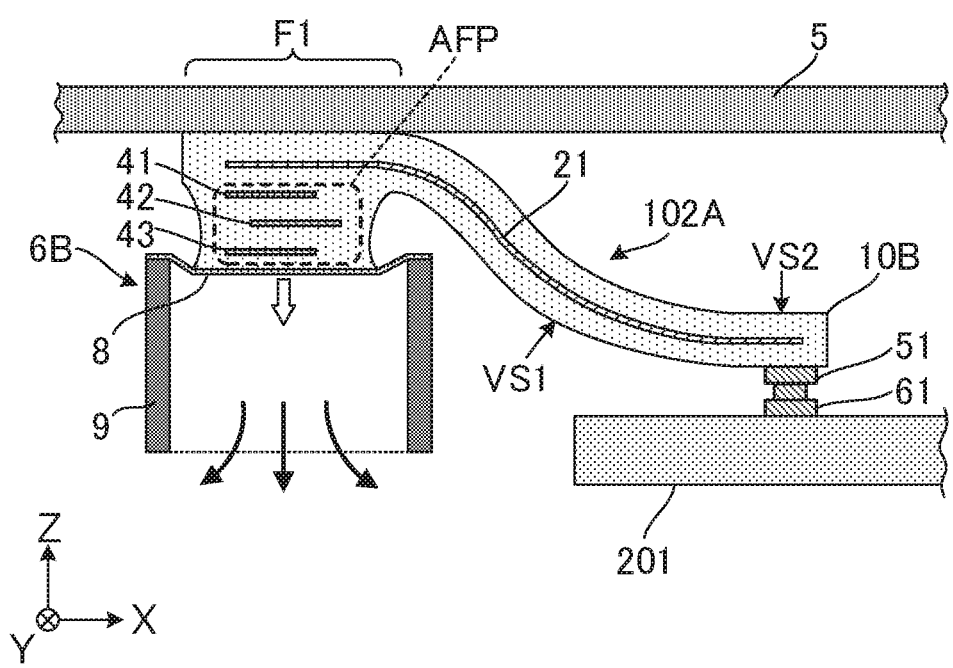
FIG. 9B is a cross-sectional view of the main portion of the electronic device 302, the view showing another state of the multilayer substrate 102A when an actuator function portion AFP is operated.

The multilayer substrate according to the second preferred embodiment of the present invention is used as follows, for example. FIG. 8 is a cross-sectional view of a main portion of an electronic device 302 in which a multilayer substrate 102A is mounted. FIG. 9A is a cross-sectional view of the main portion of the electronic device 302, the view showing a state of the multilayer substrate 102A when the actuator function portion AFP is operated. FIG. 9B is a cross-sectional view of the main portion of the electronic device 302, the view showing another state of the multilayer substrate 102A when the actuator function portion AFP is operated.

The electronic device 302 includes a multilayer substrate 102A, a housing 5, a circuit board 201, and an article 6B. The housing 5 and the circuit board 201 are the same or substantially the same as the housing 5 and the circuit board 201 that are described in the first preferred embodiment. The article 6B is a pump, for example.

The multilayer substrate 102A is different from the multilayer substrate 102 in that two connectors 51 are provided. Other configurations are the same or substantially the same as the configurations of the multilayer substrate 102. The two connectors 51 are mounted on the first principal surface VS1 of the stacked body 10B, and are connected to the plane electrodes 41 and 43, and the plane electrode 42, respectively. The article 6B includes a cylindrical frame portion 9 and a vibrating plate 8 that covers the opening of the frame portion 9.

The multilayer substrate 102A, the circuit board 201, and the article 6B are accommodated inside the housing 5. As shown in FIG. 8, the second principal surface VS2 of the first region F1 of the stacked body 10B is attached on the inside of the housing 5. The two connectors 51 included in the multilayer substrate 102A are respectively connected to two receptacles 61 mounted on the surface of the circuit board 201. As described above, the multilayer substrate 102A is connected to a circuit (a feed circuit, for example) provided in the circuit board 201. In addition, the first principal surface VS1 of the first region F1 is attached on the vibrating plate 8 of the article 6B.

In the second preferred embodiment, when voltage is applied to the piezoelectric actuator (the actuator function portion AFP), the thickness (the thickness in the Z-axis direction) of an insulating base material layer defining a piezoelectric body deforms by an electric field generated between the plane electrodes, and the vibrating plate 8 of the article 6B is displaced (as indicated by the outlined arrows shown in FIGS. 9A and 9B) in the Z-axis direction. As a result, fluid (liquid or gas) or another substance flows (as indicated by the arrow in FIG. 9A) in the frame portion 9 or flows (as indicated by the arrow in FIG. 9B) out of the inside of the frame portion 9 of the article 6B.

Third Preferred Embodiment

In a third preferred embodiment of the present invention, a description will be provided of an example of a multilayer substrate including a second insulating base material layer having different configurations.

Figure 10:
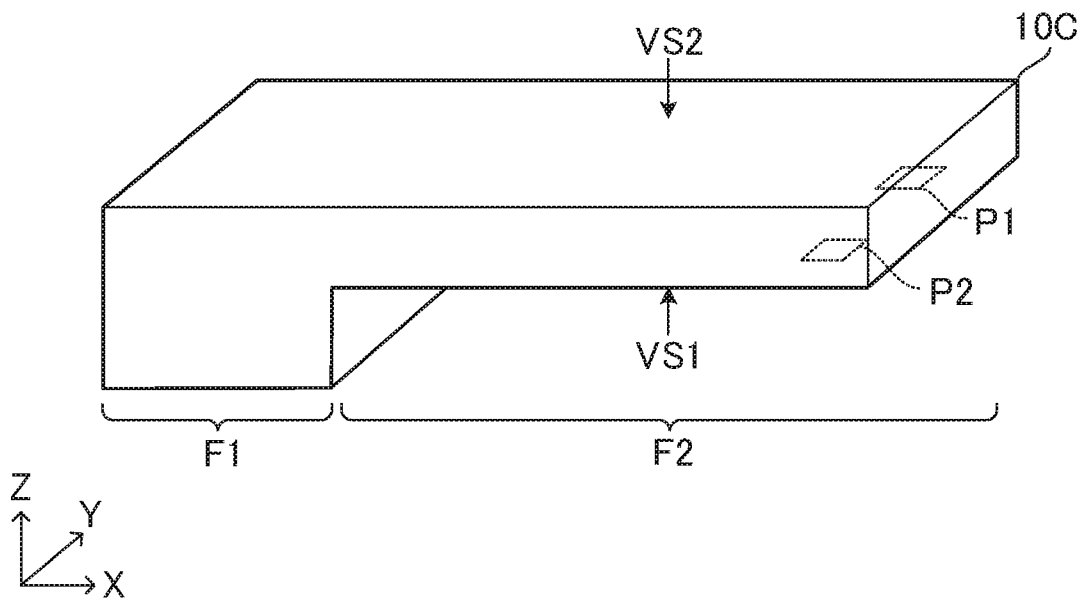
FIG. 10 is an external perspective view of a multilayer substrate 103 according to a third preferred embodiment of the present invention.
Figure 11:
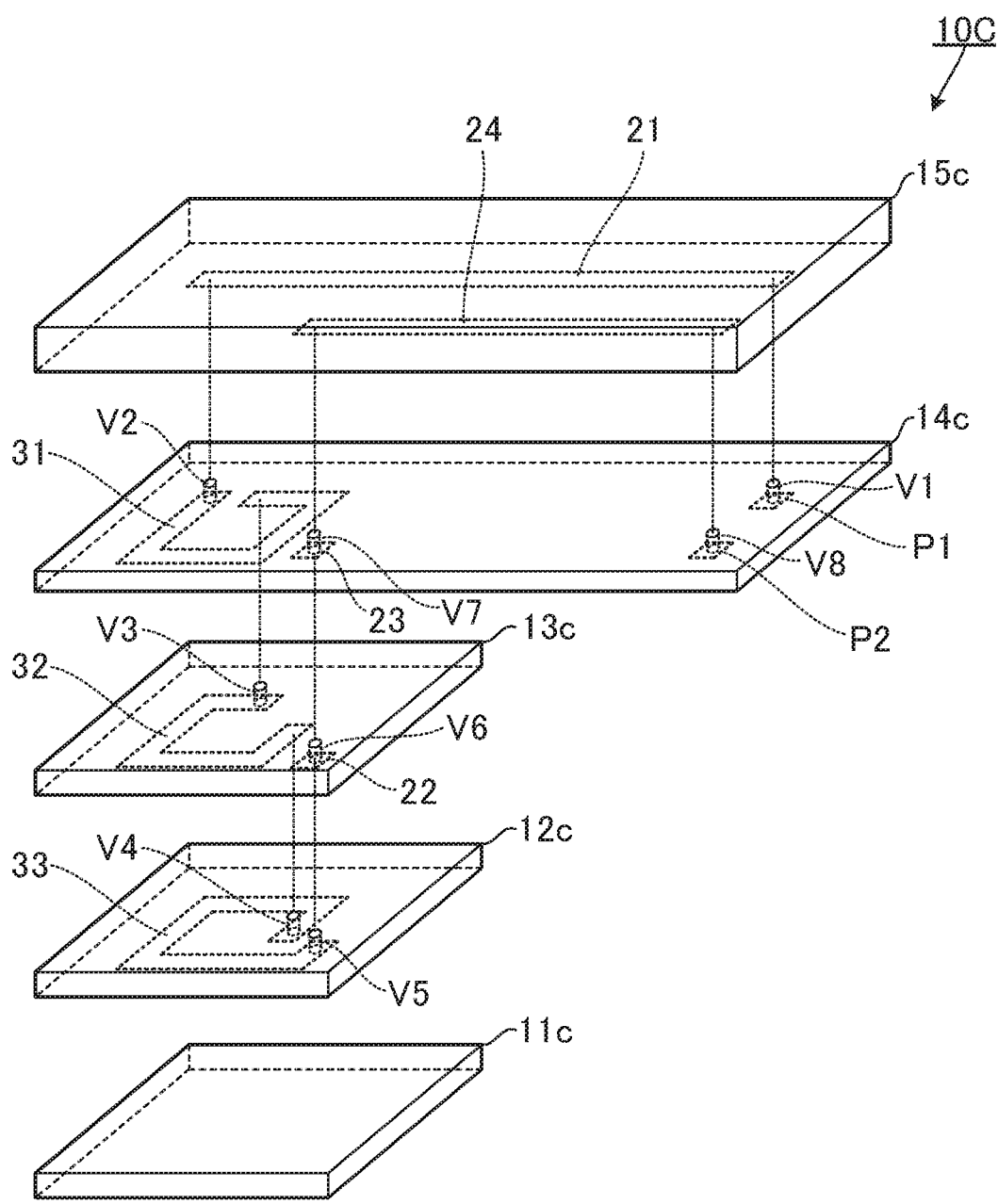
FIG. 11 is an exploded perspective view of the multilayer substrate 103.
Figure 12:
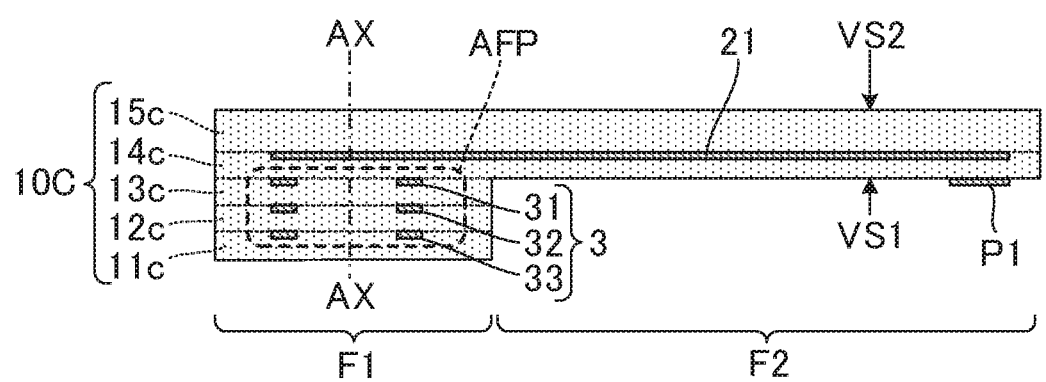
FIG. 12 is a cross-sectional view of the multilayer substrate 103.

FIG. 10 is an external perspective view of a multilayer substrate 103 according to the third preferred embodiment of the present invention. FIG. 11 is an exploded perspective view of the multilayer substrate 103. FIG. 12 is a cross-sectional view of the multilayer substrate 103.

The configuration of the insulating base material layer 14c (the second insulating base material layer) of the multilayer substrate 103 is different from the configuration of the insulating base material layer 14a (the second insulating base material layer) according to the first preferred embodiment. Other configurations are the same or substantially the same as the configurations of the multilayer substrate 101.

Hereinafter, a description will be provided of a portion that is different from the multilayer substrate 101 according to the first preferred embodiment of the present invention.

The multilayer substrate 103 includes a stacked body 10C, coil conductors 31, 32, and 33, and external connection terminals P1 and P2. The stacked body 10C is obtained by stacking a plurality of insulating base material layers 11c, 12c, 13c, 14c, and 15c that have flexibility.

In the third preferred embodiment, the insulating base material layers 11c, 12c, and 13c correspond to the "first insulating base material layer", and the insulating base material layers 14c and 15c correspond to the "second insulating base material layer".

As shown in FIG. 11 and FIG. 12, the thickness of the insulating base material layer 14c is the same or substantially the same as the thickness of the first insulating base material layer (the insulating base material layers 11c, 12c, and 13c), and is smaller than the thickness (the thickness in the Z-axis direction) of the insulating base material layer 15c (another second insulating base material layer). The other configuration of the insulating base material layer 14c is the same or substantially the same as the configuration of the insulating base material layer 14c described in the first preferred embodiment of the present invention.

It is to be noted that the insulating base material layers 11c, 12c, 13c, and 15c are the same or substantially the same as the insulating base material layers 11a, 12a, 13a, and 15a that are described in the first preferred embodiment.

With the multilayer substrate 103 according to the third preferred embodiment of the present invention, the following advantageous effects may be obtained.

In the third preferred embodiment, the thickness of the first insulating base material layer (the insulating base material layers 11c, 12c, and 13c) is smaller than the thickness of one second insulating base material layer (the insulating base material layers 15c). In addition, in the third preferred embodiment, the total (the total thickness in the Z-axis direction of the coil conductors 31, 32, and 33) of the conductor thickness of the actuator function portion AFP is larger than the total (the total thickness of the conductor 21 or the conductor 24) of the conductor thickness of the second region F2. Even with such a configuration, the conductor ratio of the actuator function portion AFP is increased more than the conductor ratio of the second region F2, and the rigidity of the actuator function portion AFP is also increased. Accordingly, even when bending stress (stress S1 in FIG. 8, for example) generated when the second region F2 is bent is applied to the first region F1, deformation of the actuator function portion AFP is significantly reduced or prevented, and characteristic changes of the actuator function portion AFP are significantly reduced or prevented.

Fourth Preferred Embodiment

In a fourth preferred embodiment of the present invention, a description will be provided of an example of a multilayer substrate including an actuator function portion (a coil) having configurations different from the configurations described in the third preferred embodiment.

Figure 13:
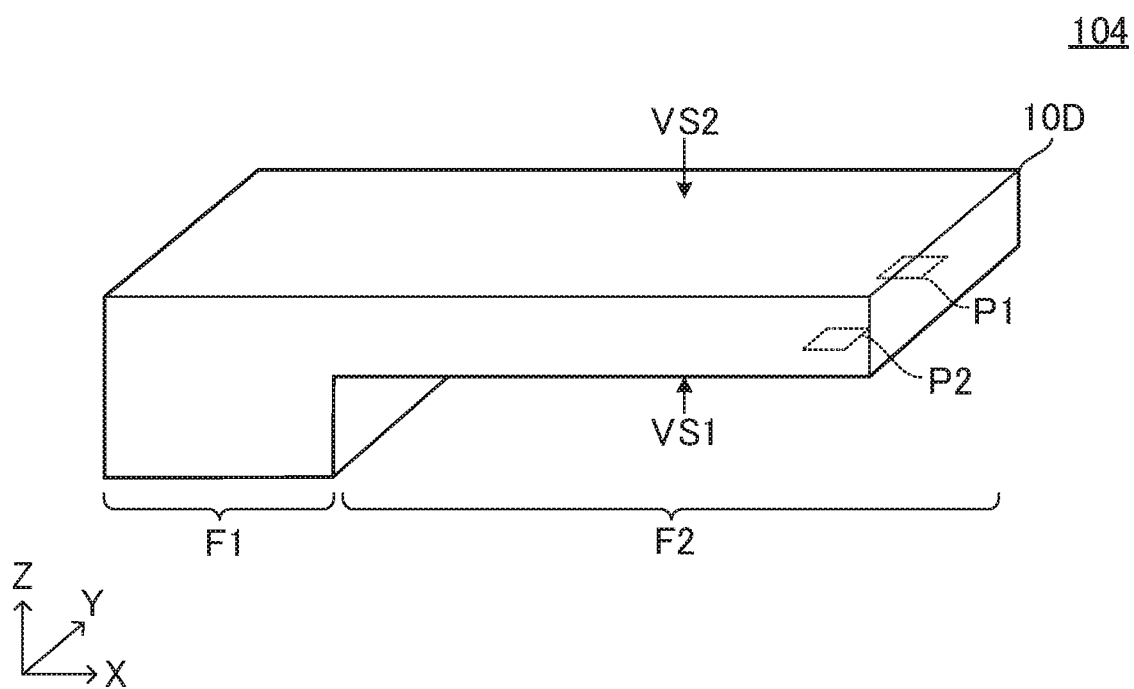
FIG. 13 is an external perspective view of a multilayer substrate 104 according to a fourth preferred embodiment of the present invention.
Figure 14:
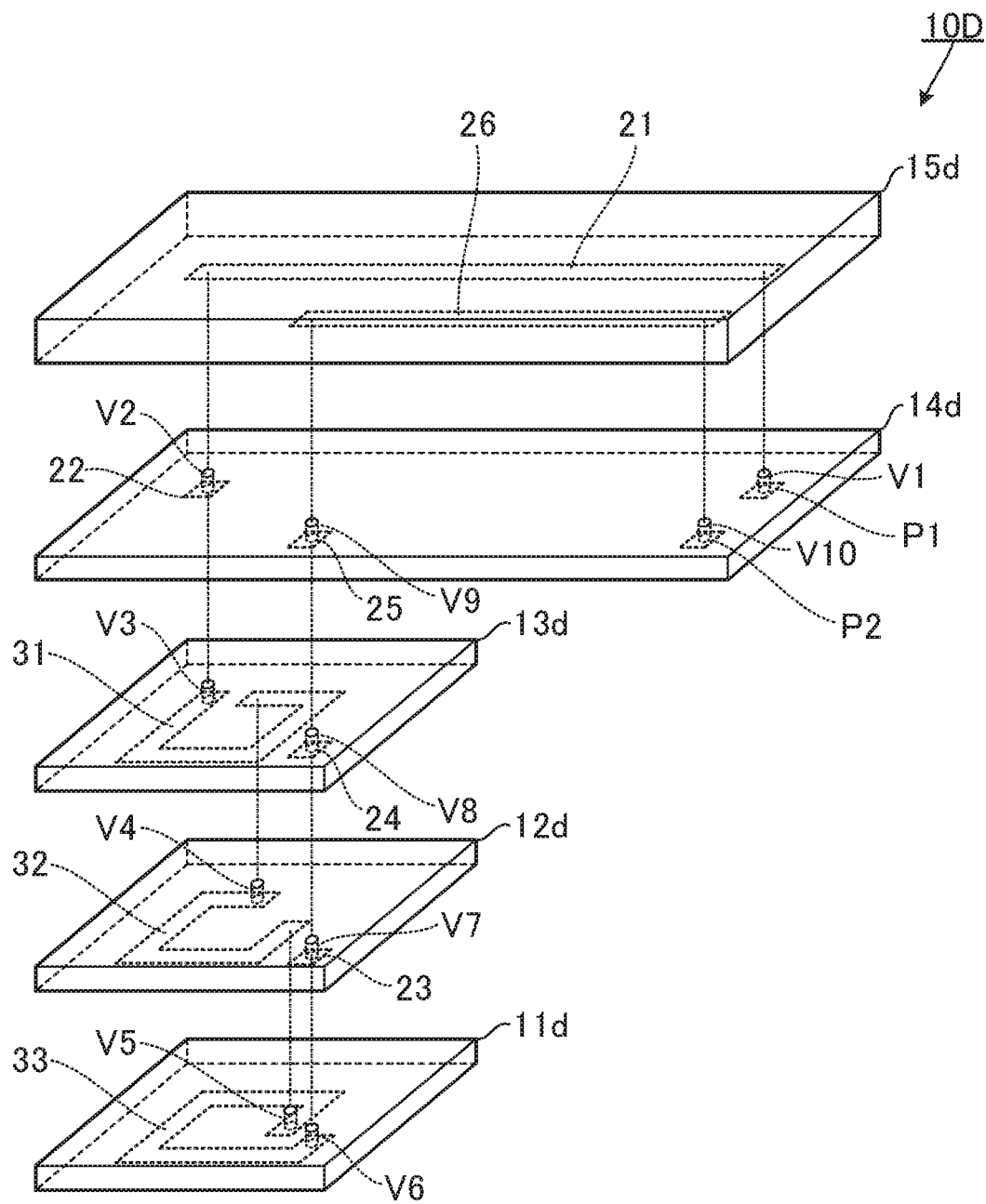
FIG. 14 is an exploded perspective view of the multilayer substrate 104.
Figure 15:
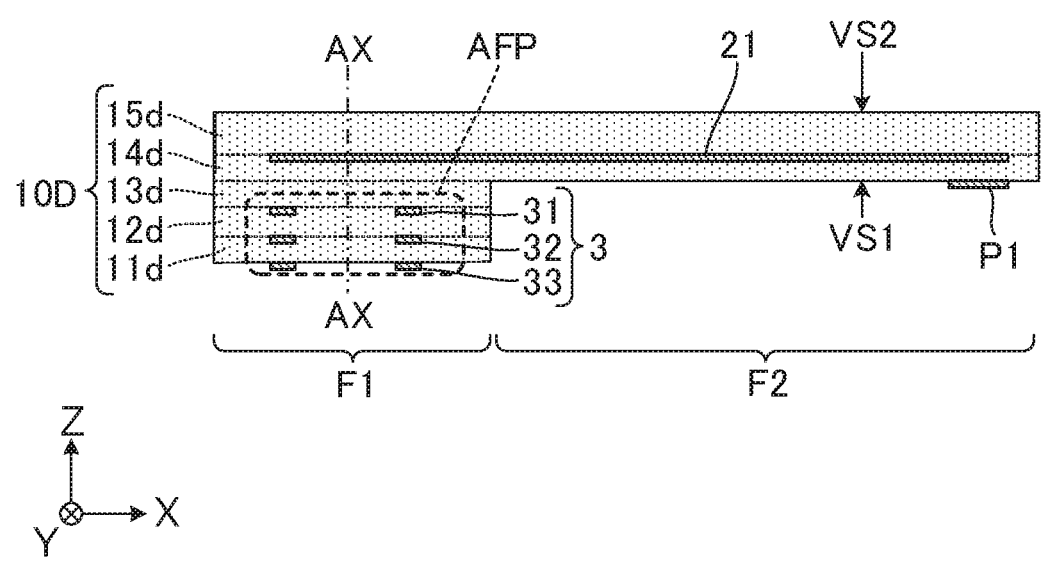
FIG. 15 is a cross-sectional view of the multilayer substrate 104.

FIG. 13 is an external perspective view of a multilayer substrate 104 according to the fourth preferred embodiment of the present invention. FIG. 14 is an exploded perspective view of the multilayer substrate 104. FIG. 15 is a cross-sectional view of the multilayer substrate 104.

Hereinafter, a description will be provided of a portion that is different from the multilayer substrate 103 according to the third preferred embodiment of the present invention.

The multilayer substrate 104 includes a stacked body 10D, coil conductors 31, 32, and 33, and external connection terminals P1 and P2. The stacked body 10D is obtained by stacking a plurality of insulating base material layers 11d, 12d, 13d, 14d, and 15d that have flexibility. The insulating base material layers 11d, 12d, 13d, 14d, and 15d are the same or substantially the same as the insulating base material layers 11c, 12c, 13c, 14c, and 15c that are described in the third preferred embodiment.

In the fourth preferred embodiment, the insulating base material layers 11d, 12d, and 13d correspond to the "first insulating base material layer", and the insulating base material layers 14d and 15d correspond to the "second insulating base material layer".

The bottom surface (the bottom surface of the insulating base material layer 11d in FIG. 14) of the insulating base material layer 11d includes a coil conductor 33. The coil conductor 33 is preferably, for example, a rectangular or substantially rectangular loop shaped conductor pattern including about one turn wound along the outer shape of the insulating base material layer 11d. In addition, the insulating base material layer 11d includes the interlayer connection conductors V5 and V6 that extend in the Z-axis direction.

The bottom surface (the bottom surface of the insulating base material layer 12d in FIG. 14) of the insulating base material layer 12d includes the coil conductor 32 and the conductor 23. The coil conductor 32 is preferably, for example, a rectangular or substantially rectangular loop shaped conductor pattern including about one turn wound along the outer shape of the insulating base material layer 12d. The conductor 23 is preferably, for example, a rectangular or substantially rectangular conductor pattern. In addition, the insulating base material layer 12d includes the interlayer connection conductors V4 and V7 that extend in the Z-axis direction.

The bottom surface (the bottom surface of the insulating base material layer 13d in FIG. 14) of the insulating base material layer 13d includes the coil conductor 31 and the conductor 24. The coil conductor 31 is preferably, for example, a rectangular or substantially rectangular loop shaped conductor pattern including about one turn wound along the outer shape of the insulating base material layer 13d. The conductor 24 is preferably, for example, a rectangular or substantially rectangular conductor pattern. In addition, the insulating base material layer 13d includes the interlayer connection conductors V3 and V8 that extend in the Z-axis direction.

The bottom surface (the bottom surface of the insulating base material layer 14d in FIG. 14) of the insulating base material layer 14d includes the conductors 22 and 25, and the external connection terminals P1 and P2. The conductors 22 and 25 are preferably, for example, rectangular or substantially rectangular conductor patterns that are disposed in the vicinity of one end (the left end portion of the insulating base material layer 14d in FIG. 14) of the insulating base material layer 14d. The external connection terminals P1 and P2 are preferably, for example, rectangular or substantially rectangular conductor patterns that are disposed in the vicinity of the other end (the right end portion of the insulating base material layer 14d in FIG. 14) of the insulating base material layer 14d. In addition, the insulating base material layer 14d includes the interlayer connection conductors V1, V2, V9, and V10 that extend in the Z axis direction.

The bottom surface (the bottom surface of the insulating base material layer 15d in FIG. 14) of the insulating base material layer 15d includes the conductors 21 and 26. The conductors 21 and 26 are preferably, for example, linear conductor patterns that extend in the X-axis direction.

As shown in FIG. 14, the external connection terminal P1 is connected to the first end of the conductor 21 through the interlayer connection conductor V1. The second end of the conductor 21 is connected to the first end of the coil conductor 31 through the interlayer connection conductors V2 and V3 and the conductor 22. The second end of the coil conductor 31 is connected to the first end of the coil conductor 32 through the interlayer connection conductor V4. The second end of the coil conductor 32 is connected to the first end of the coil conductor 33 through the interlayer connection conductor V5. The second end of the coil conductor 33 is connected to the conductor 23 through the interlayer connection conductor V6. The conductor 23 is connected to the conductor 24 through the interlayer connection conductor V7, the conductor 24 is connected to the conductor 25 through the interlayer connection conductor V8, and the conductor 25 is connected to the first end of the conductor 26 through the interlayer connection conductor V9. The second end of the conductor 26 is connected to the external connection terminal P2 through the interlayer connection conductor V10.

As shown in FIG. 14, the coil conductors 31, 32, and 33 (the actuator conductor pattern) and the interlayer connection conductors V4 and V5 define the coil 3 (the actuator function portion AFP) preferably including, for example, a rectangular or substantially rectangular helical shape including about three turns. The one end of the coil 3 is connected to the external connection terminal P1, and the other end of the coil 3 is connected to the external connection terminal P2.

In the fourth preferred embodiment, the coil conductors 31, 32, and 33, as shown in FIG. 14 and FIG. 15, are provided only on the first insulating base material layer (the insulating base material layers 11d, 12d, and 13d), and are disposed on a layer other than the boundary surface between the first insulating base material layer (the insulating base material layer 13d) and the second insulating base material layer (the insulating base material layer 14d).

According to the multilayer substrate 104 of the fourth preferred embodiment of the present invention, the following advantageous effects in addition to the advantageous effects that have been described in the third preferred embodiment may be obtained.

In the fourth preferred embodiment, the actuator conductor pattern (the coil conductors 31, 32, and 33) is provided on the first insulating base material layer (the insulating base material layers 11c, 12c, and 13c) of which the thickness is smaller than the thickness of the second insulating base material layer (the insulating base material layer 15d), and is disposed on a layer other than the boundary surface between the first insulating base material layer (the insulating base material layer 13d) and the second insulating base material layer (the insulating base material layer 14d). In other words, the actuator conductor pattern is not provided on the second insulating base material layer provided over the first region F1 and the second region F2. Accordingly, with this configuration, the independence (isolation of stress) of the actuator function portion AFP and the second region F2 is increased, and, even when bending stress generated when the second region F2 is bent is applied to the first region F1, deformation of the actuator function portion AFP is further significantly reduced or prevented.

Fifth Preferred Embodiment

A fifth preferred embodiment of the present invention describes an example of a multilayer substrate including a reinforcement film.

Figure 16:
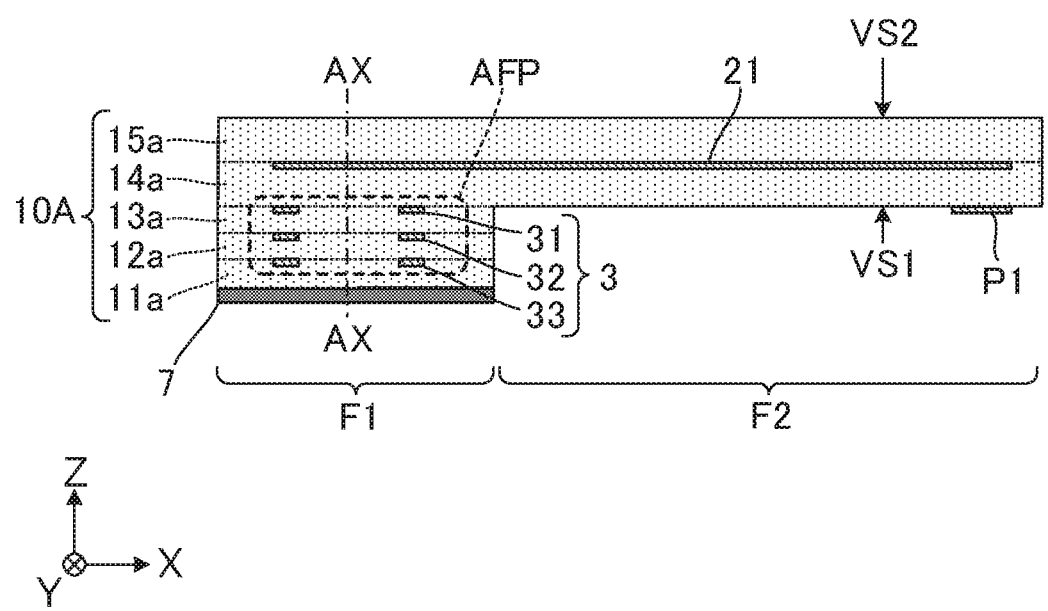
FIG. 16 is a cross-sectional view of a multilayer substrate 105 according to a fifth preferred embodiment of the present invention.

FIG. 16 is a cross-sectional view of a multilayer substrate 105 according to the fifth preferred embodiment of the present invention.

The multilayer substrate 105 is different from the multilayer substrate 101 according to the first preferred embodiment in that a reinforcement film 7 is further provided. Other configurations are the same or substantially the same as the configurations of the multilayer substrate 101.

Hereinafter, a description will be provided of a portion that is different from the multilayer substrate 101 according to the first preferred embodiment of the present invention.

The multilayer substrate 105 includes a reinforcement film 7 on the first principal surface VS1 of the first region F1 of the stacked body 10A. The reinforcement film 7 has a modulus of elasticity greater than a modulus of elasticity of the insulating base material layers 11a, 12a, 13a, 14a, and 15a that are provided on the first insulating base material layer. In the fifth preferred embodiment, the reinforcement film 7 is provided on the entire or substantially the entire bottom surface (the bottom surface of the insulating base material layer 11a in FIG. 16) of the insulating base material layer 11a. The reinforcement film 7 is preferably a resin member such as an epoxy resin, for example.

In the fifth preferred embodiment, the reinforcement film 7 having a modulus of elasticity greater than a modulus of elasticity of the plurality of insulating base material layers 11a, 12a, 13a, 14a, and 15a is provided on the first insulating base material layer (the insulating base material layer 11a). With this configuration, since the rigidity of the actuator function portion AFP is further increased, and, even when bending stress generated when the second region F2 is bent is applied to the first region F1, deformation of the actuator function portion AFP is further significantly reduced or prevented.

It is to be noted that, while the fifth preferred embodiment describes an example in which the reinforcement film 7 is provided on the entire or substantially the entire bottom surface of the insulating base material layer 11a, the present invention is not limited to this configuration. Even when the reinforcement film 7 is provided on another first insulating base material layer (the insulating base material layers 12a and 13a), similar advantageous operational effects are obtained. In addition, the reinforcement film 7 may be provided on either the top surface or the bottom surface of the first insulating base material layer or may be provided on both the top surface and the bottom surface of the first insulating base material layer. In addition, the reinforcement film 7 does not need to be provided on the entire or substantially the entire top surface (or the entire or substantially the entire bottom surface) of the first insulating base material layer and may be provided on a portion of the top surface (or a portion of the bottom surface) of the first insulating base material layer. Further, the plane shape of the reinforcement film 7 is able to be appropriately changed.

In addition, while the fifth preferred embodiment describes an example in which one reinforcement film 7 is provided on the first insulating base material layer, a plurality of reinforcement films 7 may be provided on the first insulating base material layer.

Sixth Preferred Embodiment

A sixth preferred embodiment of the present invention describes an example of a multilayer substrate including a dummy conductor.

Figure 17:
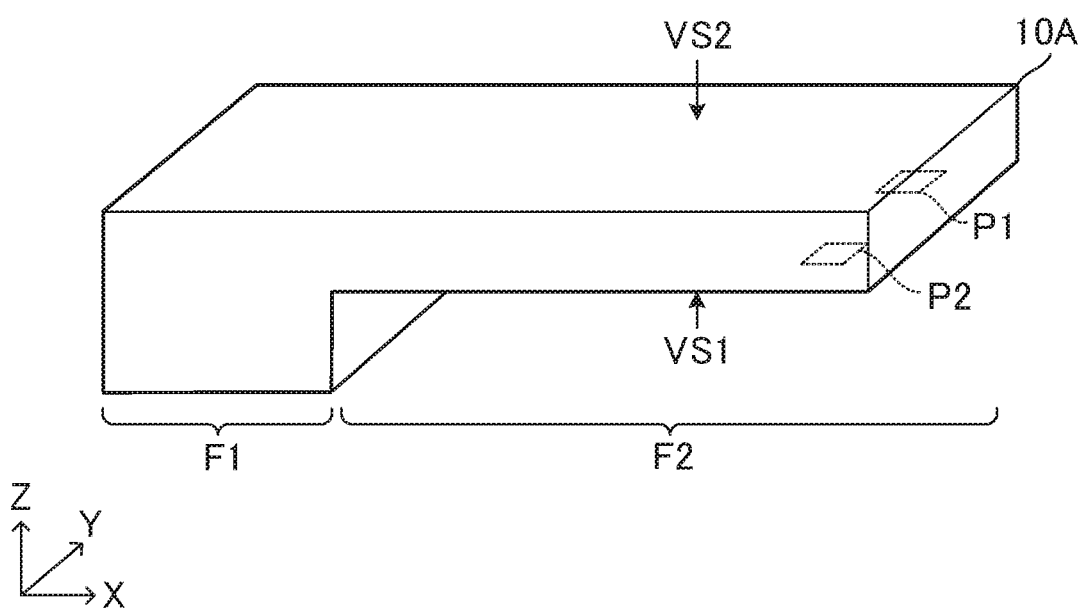
FIG. 17 is an external perspective view of a multilayer substrate 106 according to a sixth preferred embodiment of the present invention.
Figure 18:
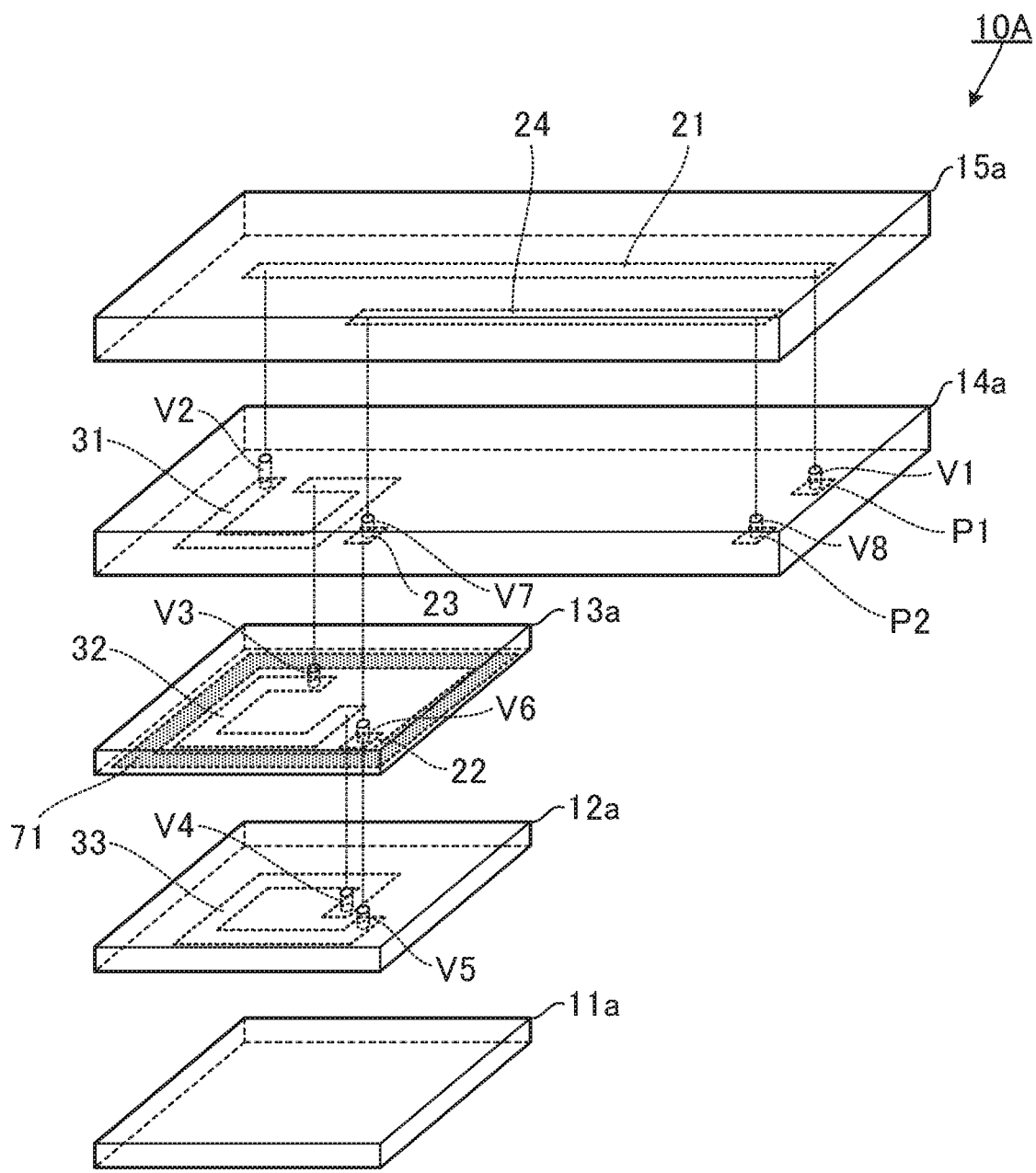
FIG. 18 is an exploded perspective view of the multilayer substrate 106.
Figure 19:
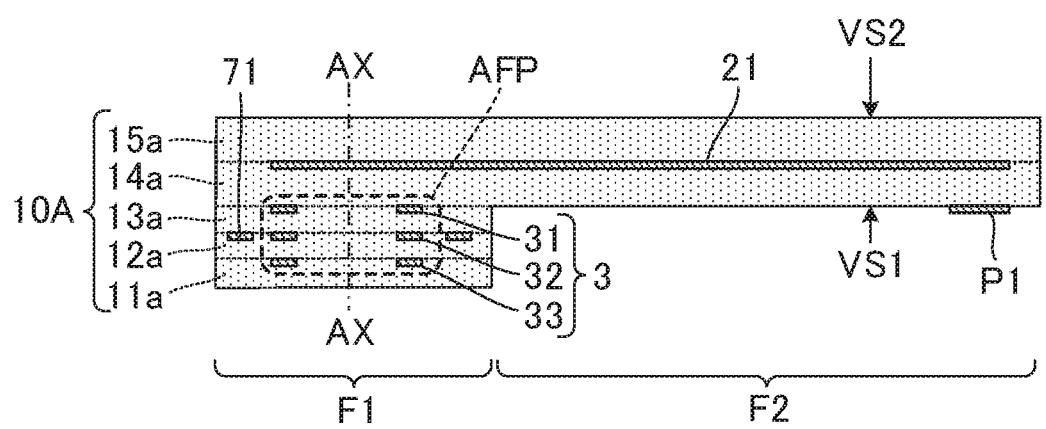
FIG. 19 is a cross-sectional view of the multilayer substrate 106.
Figure 19:
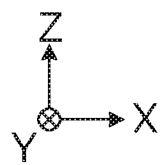

FIG. 17 is an external perspective view of a multilayer substrate 106 according to the sixth preferred embodiment of the present invention. FIG. 18 is an exploded perspective view of the multilayer substrate 106. FIG. 19 is a cross-sectional view of the multilayer substrate 106. It is to be noted that, in FIG. 18, a dummy conductor 71 is indicated by a dot pattern.

The multilayer substrate 106 is different from the multilayer substrate 101 according to the first preferred embodiment in that a dummy conductor 71 is further provided. Other configurations are the same or substantially the same as the configurations of the multilayer substrate 101.

Hereinafter, a description will be provided of a portion that is different from the multilayer substrate 101 according to the first preferred embodiment of the present invention.

The multilayer substrate 106 includes a dummy conductor 71 disposed in the first region F1 of the stacked body 10A. The dummy conductor 71 is provided on the first insulating base material layer and is not electrically connected to the actuator conductor pattern (the coil conductors 31, 32, and 33). In the sixth preferred embodiment, the dummy conductor 71 is preferably, for example, a ring shaped conductor pattern along the outline of the insulating base material layer 13a, and is provided on the bottom surface (the bottom surface of the insulating base material layer 13a in FIG. 18) of the insulating base material layer 13a. The dummy conductor 71 is preferably made of a Cu foil or other suitable material, for example.

The multilayer substrate 106 according to the sixth preferred embodiment includes the dummy conductor 71 provided on the first insulating base material layer (the insulating base material layer 13a). With this configuration, the conductor ratio of the actuator function portion AFP is further increased and the rigidity of the actuator function portion AFP is further increased. Accordingly, even when bending stress generated when the second region F2 is bent is applied to the first region F1, deformation of the actuator function portion AFP is further significantly reduced or prevented.

It is to be noted that, while the sixth preferred embodiment describes an example in which the ring shaped dummy conductor 71 is provided on the bottom surface of the insulating base material layer 13a, the present invention is not limited to this configuration. Even when the dummy conductor 71 is provided on another first insulating base material layer (the insulating base material layers 11a and 12a), similar advantageous operational effects are obtained. In addition, the dummy conductor 71 may be provided on either the top surface or the bottom surface of the first insulating base material layer or may be provided on both the top surface and the bottom surface of the first insulating base material layer. In addition, the plane shape of the dummy conductor 71 is able to be appropriately changed. The planar shape of the dummy conductor 71 may be a circle, an ellipse, a polygon, a C shape, a T shape, or a Y shape, for example. However, the dummy conductor 71 is preferably provided so as to surround the actuator conductor pattern, so that deformation of the actuator function portion AFP is significantly reduced or prevented effectively.

While each of the above-described preferred embodiments describes an example in which the stacked body has a rectangular or substantially rectangular flat plate, the present invention is not limited to this configuration. The planar shape of the stacked body is able to be appropriately changed within the scope of obtaining the functions and advantageous effects of the preferred embodiments of the present invention, and may be a polygon, a circle, an ellipse, an L shape, a crank shape, a T shape, and a Y shape, for example.

In addition, while each of the above-described preferred embodiments is a non-limiting example of a multilayer substrate including a stacked body obtained by stacking five insulating base material layers (three first insulating base material layers and two second insulating base material layers), the present invention is not limited to this configuration. The number of layers of insulating base material layers to obtain the stacked body is able to be appropriately changed within the scope of obtaining the functions and advantageous effects of the preferred embodiments of the present invention. For example, the number of first insulating base material layers may be one, or four or more, and the number of second insulating base material layers may be one, or three or more.

It is to be noted that, while each of the above-described preferred embodiments is a non-limiting example of obtaining a stacked body by stacking a plurality of insulating base material layers made of a thermoplastic resin and heating and pressurizing the plurality of insulating base material layers, the present invention is not limited to this configuration. For example, a stacked body may be obtained by heating and pressurizing a body stacked with a semi-hardened prepreg resin interposed between the plurality of insulating base material layers made of a thermosetting resin.

While the first, the third, the fourth, the fifth, and the sixth preferred embodiments described above describe an example of the actuator function portion AFP being the coil 3 having a rectangular or substantially rectangular helical shape including about three turns, the coil being the actuator function portion AFP is not limited to this configuration. The number of turns and configurations of the coil 3 are able to be appropriately changed within the range of the scope of obtaining the functions and advantageous effects of the preferred embodiments of the present invention. The coil 3 may have a plane loop shape or a plane spiral shape, for example, or may have a configuration in which plane spiral shaped coil conductors are connected to each other. The number of turns of the coil is also able to be appropriately changed.

In addition, while the first, the third, the fourth, the fifth, and the sixth preferred embodiments described above describe an example of the actuator function portion AFP being the coil 3 having the winding axis AX in the Z-axis direction, the present invention is not limited to this configuration. The winding axis AX of the coil 3 does not necessarily extend in the Z-axis direction and is able to be appropriately changed. The winding axis AX of the coil 3 may extend in the X-axis direction or in the Y-axis direction, for example.

While each of the preferred embodiments described above describes an example of the multilayer substrate including only the actuator function portion AFP (the coil or the piezoelectric actuator), a circuit configuration provided in the multilayer substrate (the stacked body) is not limited to this configuration. The circuit provided in the stacked body is able to be appropriately changed within the range of the scope of obtaining the functions and advantageous effects of the preferred embodiments of the present invention. For example, a capacitor, various types of transmission lines (such as a stripline, a microstrip line, a meander, and a coplanar), or other suitable devices defined by a conductor pattern may be provided in contact with the stacked body. In addition, for example, a chip component such as a chip inductor or a chip capacitor may be mounted in contact with the stacked body.

It is to be noted that, while the above-described first and second preferred embodiments describe an example in which the multilayer substrate is connected to the circuit board using the connector included in the multilayer substrate, the present invention is not limited to this configuration. The external connection terminal of the multilayer substrate may be connected to a circuit board or other suitable structure through a conductive bonding material such as solder.

In addition, while each of the above-described preferred embodiments describes an example of the multilayer substrate including the external connection terminals P1 and P2 on the first principal surface VS1 of the stacked body, the present invention is not limited to the configuration. The arrangement of the external connection terminals P1 and P2 is able to be appropriately changed within the range of the scope of obtaining the functions and advantageous effects of the preferred embodiments of the present invention. The external connection terminal may be provided on the second principal surface VS2 of the stacked body or may be provided on both the first principal surface VS1 and the second principal surface VS2 of the stacked body. In addition, while each of the above-described preferred embodiments describes an example in which the number of external connection terminals is two, the number of external connection terminals is able to be appropriately changed according to the circuit provided in contact with the stacked body. Further, the plane shape of the external connection terminals P1 and P2 is not limited to a rectangle or substantially a rectangle. The plane shape of the external connection terminals is able to be appropriately changed within the scope of obtaining the functions and advantageous effects of the preferred embodiments of the present invention, and may be a square, a polygon, a circle, an ellipse, an L shape, and a T shape, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a stacked body including a plurality of first insulating layers and a plurality of second insulating layers that are stacked and have flexibility, the stacked body including a first region and a second region; and
   an actuator conductor pattern provided on each of the plurality of first insulating layers in the first region; wherein
   a number of stacked layers of the plurality of first and second insulating layers in the first region is greater than a number of stacked layers of the plurality of second insulating layers in the second region;
   the plurality of second insulating layers are provided over the first region and the second region;
   the plurality of the first insulating layers are provided only in the first region;
   the first region is obtained by stacking the plurality of first insulating layers and the plurality of second insulating layers and includes an actuator function portion in a portion, the actuator function portion including the actuator conductor patterns;
   a thickness of the stacked body in the second region is smaller than a thickness of the stacked body in the first region;

a thickness of each of the plurality of first insulating layers which are provided only in the first region in which the thickness of the stacked body is larger than the thickness of the stacked body in the second region is smaller than a thickness of one of the plurality of second insulating layers;

a conductor ratio of the actuator function portion in the first region in which the thickness of the stacked body is larger than the thickness of the stacked body in the second region is higher than a conductor ratio of the stacked body in the second region in which the thickness of the stacked body is smaller than the thickness of the stacked body in the first region; and a rigidity of the conductor pattern is higher than a rigidity of the plurality of first insulating layers which are provided only in the first region in which the thickness of the stacked body is larger than the thickness of the stacked body in the second region.

2. The multilayer substrate according to claim 1, wherein the thickness of each of the plurality of first insulating layers which are provided only in the first region in which the thickness of the stacked body is larger than the thickness of the stacked body in the second region is smaller than a thickness of at least two second insulating layers among the plurality of second insulating layers.

3. The multilayer substrate according to claim 1, wherein the thickness of each of the plurality of first insulating layers which are provided only in the first region in which the thickness of the stacked body is larger than the thickness of the stacked body in the second region is smaller than a thickness of each second insulating layer among the plurality of second insulating layers.

4. The multilayer substrate according to claim 1, wherein the actuator conductor patterns are provided only on each of the plurality of first insulating layers and are disposed on layers other than a boundary surface between the plurality of first insulating layers and the plurality of second insulating layers.

5. The multilayer substrate according to claim 1, further comprising a reinforcement film in contact with one of the plurality of first insulating layers and having a modulus of elasticity greater than a modulus of elasticity of the plurality of first and second insulating layers.

6. The multilayer substrate according to claim 1, further comprising a dummy conductor in contact with one of the plurality of first insulating layers and not electrically connected to the actuator conductor patterns.

7. The multilayer substrate according to claim 1, wherein the actuator conductor patterns include a coil conductor.

8. The multilayer substrate according to claim 1, wherein the actuator conductor patterns provided on each of the plurality of first insulating layers are coil conductors.

9. The multilayer substrate according to claim 1, wherein the actuator conductor patterns provided on each of the plurality of first insulating layers are plane electrodes that are opposed in a stacking direction of the stacked body.

10. The multilayer substrate according to claim 1, wherein the stacked body is a rectangular or substantially rectangular flat plate.

11. The multilayer substrate according to claim 1, wherein the plurality of first and second insulating layers are resin layers.

12. The multilayer substrate according to claim 1, wherein the plurality of first insulating layers are free from external connection terminals.

13. The multilayer substrate according to claim 7, wherein the coil conductor is a rectangular or substantially rectangular loop shaped conductor pattern including about one turn wound along an outer periphery of the plurality of first insulation layers.

14. The multilayer substrate according to claim 8, wherein each of the coil conductors is a rectangular or substantially rectangular loop shaped conductor pattern including about one turn wound along an outer periphery of a respective one of the plurality of first insulating layers.

15. The multilayer substrate according to claim 8, wherein the coil conductors define a coil including a rectangular or substantially rectangular helical shape including about three turns.

16. The multilayer substrate according to claim 9, wherein the plurality of first insulating layers have piezoelectric properties.

17. The multilayer substrate according to claim 9, wherein the plurality of first insulating layers are made of polyvinylidene fluoride.

18. The multilayer substrate according to claim 9, wherein the plane electrodes are made of a Cu foil.

19. The multilayer substrate according to claim 11, wherein the plurality of first and second insulating layers are made of polyimide or liquid crystal polymer.

20. The multilayer substrate according to claim 11, wherein the actuator conductor patterns are made of Cu foil.

* * * * *